US006959032B1

(12) United States Patent
Richards et al.

(10) Patent No.: US 6,959,032 B1
(45) Date of Patent: Oct. 25, 2005

(54) METHOD AND APPARATUS FOR POSITIONING PULSES IN TIME

(75) Inventors: James L. Richards, Fayetteville, TN (US); Mark D. Roberts, Huntsville, AL (US); Marcus H. Pendergrass, Huntsville, AL (US)

(73) Assignee: Time Domain Corporation, Huntsville, AL (US)

( * ) Notice: Subject to any disclaimer, the term of this patent is extended or adjusted under 35 U.S.C. 154(b) by 1045 days.

(21) Appl. No.: 09/638,150

(22) Filed: Aug. 15, 2000

Related U.S. Application Data

(63) Continuation-in-part of application No. 09/592,248, filed on Jun. 12, 2000.

(51) Int. Cl.[7] .......................... H04B 1/69; H03K 7/04; H03K 9/04
(52) U.S. Cl. ....................................... 375/138; 375/239
(58) Field of Search ................................. 375/138, 130, 375/239; 370/310, 342

(56) References Cited

U.S. PATENT DOCUMENTS

| | | |
|---|---|---|
| 3,728,632 A | 4/1973 | Ross |
| 4,170,757 A | 10/1979 | Skudera et al. |
| 4,641,317 A | 2/1987 | Fullerton |
| 4,743,906 A | 5/1988 | Fullerton |
| 4,813,057 A | 3/1989 | Fullerton |
| 4,928,316 A | 5/1990 | Heritage et al. |
| 4,979,186 A | 12/1990 | Fullerton |
| 5,363,108 A | 11/1994 | Fullerton |
| 5,377,225 A | 12/1994 | Davis |
| 5,610,907 A | 3/1997 | Barrett |
| 5,677,927 A | 10/1997 | Fullerton et al. |
| 5,687,169 A | 11/1997 | Fullerton |
| 5,793,759 A | 8/1998 | Rakib et al. |
| 5,832,035 A | 11/1998 | Fullerton |
| 5,960,031 A | 9/1999 | Fullerton et al. |
| 5,963,581 A | 10/1999 | Fullerton et al. |
| 6,160,802 A | 12/2000 | Barrett |

OTHER PUBLICATIONS

S.V. Maric et al., "A Class of Frequency Hop Codes With Nearly Ideal Characteristics For Use In Multiple–Access Spread–Spectrum Communications And Radar And Sonar Systems", IEEE Transactions ofn Communications, vol. 40(9):1442–1447, (1992).

(Continued)

*Primary Examiner*—Khai Tran
*Assistant Examiner*—David B. Lugo
(74) *Attorney, Agent, or Firm*—Venable LLP; Robert Babavi

(57) ABSTRACT

A coding method specifies pulse positioning over time according to a time layout about a time reference where a pulse can be placed at any location within the time layout. The method generates time-hopping codes having pre-defined properties, and a coded pulse train based on the time-hopping codes and the time layout. The time reference may be fixed or non-fixed and can be a time position of a preceding or a succeeding pulse. In addition, the predefined properties can be autocorrelation, cross-correlation, or spectral properties.

28 Claims, 17 Drawing Sheets

OTHER PUBLICATIONS

E. L Titlebaum et al., "Time–Frequency Hop Signals Part I: Coding Based Upon The Theory Of Linear Congruences", IEEE Transactions On Aerospace And Electronic Systems, vol. AES–17(4):490–493, (1981).

E. L. Titlebaum et al., "Time–Frequency Hop Signals Part II: Coding Based Upon Quadratic Congruences", IEEE Transactions On Aerospace And Electronic Systems, vol. AES–17(4):494–500, (1981).

E.L. Titlebaum et al., "Ambiguity Properties Of Quadratic Congruential Coding", IEEE Transactions On Aerospace And Electronic Systems, vol. 27(1): 18–29, (1991).

R.A. Scholtz, "Multiple Access With Time–Hopping Implulse Modulation", Communication Science Institute, University of Southern California, Los Angeles, CA (1993).

A. Albicki et al., "Transmitter And Receiver Design For Pilot Project, Phase 1", Technical Report #1, for Rochester Gas and Electric Corporation, pp. 726–742, (1988).

Bellegarda et al., "Time–Frequency Hop Codes Based Upon Extended Quadratic Congrences", IEEE Transactions On Aerospace And Electronic Systems, vol. 24(6):726–742, (1988).

Bellegarda et al., "The Hit Array: An Analysis Formalism For Multiple Access Frequency Hop Coding", IEEE Transactions On Aerospace And Electronic Systems, vol. 27(1):30–39,(1991).

Bellegarda et al., "Amendment to time–Frequency Hop Codes Based Upon Extended Quadratic Congruences", IEEE Transactions On Aerospace And Electronic Systems, vol. 27(1):167–172, (1991).

Drumheller et al., "Cross–Correlation Properties Of Algebraically Constructed Costas Arrays", IEEE Transactions On Aerospace And Electronic Systems, vol. 27:2–10, (1991).

Kostic et al., "The Design Of New Opitcal Codes And Time–Hopping Patterns For Synchronous Spread–Spectrum Code Division Multiple–Access Communication Systems", IEEE, ICC, pp. 585–589, (1991).

Comments of Pulson Communications Corporation before the Federal Communications Commission, 1992.

METHOD AND APPARATUS FOR POSITIONING PULSES IN TIME

CROSS-REFERENCE TO OTHER APPLICATIONS

This is a Continuation-in-Part of application Ser. No. 09/592,248 filed Jun. 12, 2000.

U.S. patent application No. 09/638,192 entitled "A METHOD FOR SPECIFYING NON-TEMPORAL PULSE CHARACTERISTICS", filed concurrently herewith.

U.S. patent application No. 09/638,046 entitled "A METHOD AND APPARATUS FOR APPLYING CODES HAVING PRE-DEFINED PROPERTIES", filed concurrently herewith, now U.S. Pat. No. 6,671,310.

U.S. patent application No. 09/637,878 entitled "A METHOD AND APPARATUS FOR POSITIONING PULSES USING A LAYOUT HAVING NON-ALLOWABLE REGIONS", filed concurrently herewith.

U.S. patent application No. 09/638,151 entitled "A METHOD AND APPARATUS FOR MAPPING PULSES TO A NON-FIXED LAYOUT", filed concurrently herewith.

U.S. patent application No. 09/638,152 entitled "A METHOD AND APPARATUS FOR SPECIFYING PULSE CHARACTERISTICS USING A CODE THAT SATISFIES PREDEFINED CRITERIA", filed concurrently herewith, now abandoned.

U.S. patent application No. 09/638,153 entitled "METHOD FOR SPECIFYING PULSE CHARACTERISTICS USING CODES", filed concurrently herewith.

U.S. patent application No. 09/638,154 entitled "A METHOD FOR SPECIFYING NON-ALLOWABLE PULSE CHARACTERISTICS", filed concurrently herewith, now abandoned. The above-listed applications are incorporated herein by reference in their entireties.

TECHNICAL FIELD

The present invention relates to impulse transmission systems and, more particularly, to a method of applying time-hopping codes for time positioning of pulses in an impulse transmission system.

BACKGROUND OF THE INVENTION

As the availability of communication bandwidth in the increasingly crowded frequency spectrum is becoming a scarce and valuable commodity, Time Modulated Ultra Wideband (TM-UWB) technology provides an excellent alternative for offering significant communication bandwidth particularly, for various wireless communications applications. Because TM-UWB communication systems are based on communicating extremely short-duration pulses (e.g., pico-seconds in duration), such systems are also known as impulse radio systems. Impulse radio systems were first described in a series of patents, including U.S. Patent Nos. 4,641,317 (issued Feb. 3, 1987), 4,813,057 (issued Mar. 14, 1989), 4,979,186 (issued Dec. 18, 1990), and 5,363,057 (issued Nov. 8, 1994) to 15 Larry W. Fullerton, and U.S. Patent Nos. 5,677,927 (issued Oct. 14, 1997), 5,687,169 (issued Nov. 11, 1997), and 5,832,035 (issued Nov. 3, 1998) to Larry W. Fullerton, et at. These patents are incorporated herein by reference.

Multiple access impulse radio systems are radically different from conventional Code Division Multiple Access (CDMA), Time Division Multiple Access (TDMA) and Frequency Division Multiple Access (FDMA) systems. Unlike such systems, which use continuous sinusoidal waveforms for transmitting information, a conventional impulse radio transmitter emits a low power electromagnetic train of short pulses, which are shaped to approach a Gaussian monocycle. As a result, the impulse radio transmitter uses very little power to generate noise-like communication signals for use in multiple-access communications, radar and positioning applications, among other things. In the multi-access communication applications, the impulse radio systems depend, in part, on processing gain to achieve rejection of unwanted signals. Because of the extremely high achievable processing gains, the impulse radio systems are relatively immune to unwanted signals and interference, which limit the performance of systems that use continuous sinusoidal waveforms. The high processing gains of the impulse radio systems also provide much higher dynamic ranges than those commonly achieved by the processing gains of other known spread-spectrum systems.

Impulse radio communication systems transmit and receive the pulses at precisely controlled time intervals, in accordance with a time-hopping code. As such, the time-hopping code defines a communication channel that can be considered as a unidirectional data path for communicating information at high speed. In order to communicate the information over such channels, typical impulse radio transmitters use position modulation, which is a form of time modulation, to position the pulses in time, based on instantaneous samples of a modulating information signal. The modulating information signal may for example be a multi-state information signal, such as a binary signal. Under this arrangement, a modulator varies relative positions of a plurality of pulses on a pulse-by-pulse basis, in accordance with the modulating information signal and a specific time-hopping code that defines the communication channel.

In applications where the modulating information signal is a binary information signal, each binary state may modulate the time position of more than one pulse to generate a modulated, coded timing signal that comprises a train of identically shaped pulses that represent a single data bit. The impulse transmitter applies the generated pulses to a specified transmission medium, via a coupler, such as an antenna, which electromagnetically radiates the pulses for reception by an impulse radio receiver. The impulse radio receiver typically includes a single direct conversion stage. Using a correlator, the conversion stage coherently converts the received pulses to a baseband signal, based on a priori knowledge of the time-hopping code. Because of the correlation properties of-the selected time-hopping codes, the correlator integrates the desired received pulses coherently, while the undesired noise signals are integrated non-coherently such that by comparing the coherent and non-coherent integration results, the impulse receiver can recover the communicated information.

Conventional spread-spectrum code division multiple access (SS-CDMA) techniques accommodate multiple users by permitting them to use the same frequency bandwidth at the same time. Direct sequence CDMA systems employ pseudo-noise (PN) codewords generated at a transmitter to "spread" the bandwidth occupied by transmitted data beyond the minimum required by the data. The conventional SS-CDMA systems employ a family of orthogonal or quasi-orthogonal spreading codes, with a pilot spreading code sequence synchronized to the family of codes. Each user is assigned one of the spreading codes as a spreading function. One such spread-spectrum system is described in U.S. Pat. No. 4,901,307 entitled Unlike direct sequence spread-spectrum systems, the time-hopping code for impulse radio communications is not necessary for energy spreading, because the monocycle pulses themselves have an inherently wide bandwidth. Instead, the impulse radio systems use the time-hoping codes for channelization, energy smoothing in the frequency domain, and interference suppression. The time-hoping code defines a relative position of each pulse within a group of pulses, or pulse train, such that the combination of pulse positions defines the communications channel. In order to convey information on such communication channel, each state of a multi-state information signal varies a relative pulse position by a predefined time shift such that a modulated, coded timing signal is generated comprising a train of pulses, each with timing corresponding to the combination of the time position coding and the multi-state modulation.

In one conventional binary approach, pulses arc time-modulated forward or backward about a nominal position. More specifically, each pulse is time modulated by adjusting its position within a time frame to one of two or more possible times. For example, in order to send a "0" binary bit during the time frame, the pulse may be offset from a nominal position of the time frame by about −50 pico-seconds. For a "1" binary state, the pulse may be offset from the nominal position by about +50 pico-seconds. Conventional coders that generate the time-hoping code do so in response to a periodic timing signal that corresponds to the data-rate of the multi-state information signal. The data rate of the impulse radio transmission may for example be a fraction of a periodic timing signal that is used as a time base or time reference.

In practice, decoding errors are minimized using distinctive time-hopping codes with suitable autocorrelation and cross-correlation properties. The cross-correlation between any two time-hopping codes should be low for minimal interference between multiple users in a communications system or between multiple target reflections in radar and positioning applications. At the same time, the autocorrelation property of a time-hoping code should be steeply peaked, with small side-lobes. Maximally peaked time-hopping code autocorrelation yields optimal acquisition and synchronization properties for communications, radar and positioning applications.

Various coding schemes with known correlation characteristics are available. For example, algebraic codes, Quadratic Congruential (QC) codes, Hyperbolic Congruential (HC) codes and optical codes have been suggested in the past for coding in impulse radio systems. Generally, based on known assumptions, the coding schemes guarantee a maximum number of pulse coincidences, i.e., hits, for any defined time flame or time frame shift during which the codes are repeated. For example, HC codes are guaranteed a maximum of two hits for any sub-frame or frame shift.

McCorkle in U.S. Pat. No. 5,847,677 discloses a random number generator for generating a pseudo-random code for use with jittered pulse repetition interval radar systems. The code is generated by a random number generator that possesses certain attributes desirable for a jittered radar. As disclosed, the attributes related to a flat frequency spectrum, a nearly perfect spike for an autocorrelation function, a controllable absolute minimum and maximum interval, long sequences that do not repeat, and a reasonable average pulse rate.

One known coding technique for an impulse radio is disclosed by Barrett in U.S. Pat. No. 5,610,907,entitled "Ultrafast Time Hopping CDMA-RF Communications: Code-As-Carrier, Multichannel Operation, High data Rate Operation and Data Rate on Demand." According to the disclosed techniques, two levels of coding are used: major orthogonal codes are applied to provide multiple channels, and forward error correction (FEC) codes are applied to information data before transmission. The disclosed system relies on dividing time into repetitive super-frames, frames and sub-frames. As disclosed, a super-frame corresponds to a time interval of about 1 millisecond, representing one repetition of a code pattern, where as a frame is defined as a time interval of about 1 microsecond divided according to a code length. A sub-frame corresponds to a short time interval of about 1 nano second during which a pulse is time positioned.

Because of practical limitations associated with arbitrarily positioning of pulses in adjacent frames, each frame may have to be divided into allowable and non-allowable time regions for positioning a pulse. One such limitation is associated with hardware limitation on minimum pulse-to-pulse time for respective positioning of two pulses on adjacent frames arbitrarily. The system disclosed in Barrett uses a fraction of frame time for encoding and designates the remainder as a RESET period.

The above-described coding methods pulse trains that have less than desired correlation properties. Therefore, there exists a need for a method of mapping that produces desired correlation properties.

SUMMARY OF THE INVENTION

Briefly, according to the present invention, a method of mapping pulses over time specifies a time layout. Then based on a generated time-hopping code, the pulses are positioned at any place within the time layout. In an exemplary embodiment, the pulses are mapped relative to a time reference that may be a fixed or a non-fixed time reference. The non-fixed reference may be a relative reference, for example, relative to a time position of a pulse. In one embodiment, the pulse may be a preceding pulse. In another, the pulse may be a succeeding pulse.

According to some of the more detailed features of the invention, the generated time hopping code may have a predefined property, including correlation or spectral properties. The correlation properties may include cross-correlation or auto-correlation properties. The generated time-hopping code may be a hyperbolic congruential code, quadratic congruential code, linear congruential code, Welch-Costas array code, Golomb-Costas array code, pseudorandom code, chaotic code, or Optimal Golomb Ruler code.

DETAILED DESCRIPTION

The present invention provides a method of using a generated code to specify positions and other characteristics of pulses within a pulse train. Usually, each generated code consists of a set or a number of code element values. The method of the invention involves defining a layout of the time period over which the pulses are overlaid. A mapping approach maps the code element values to pulse positions over the layout based on the generated code. In an exemplary embodiment, the code is generated using a numerical code generation technique, and code element values are mapped to pulse positions in accordance with the defined time period layout and code mapping approach.

Time Period Layouts

In a pulse transmission system, a sequence of pulses known as a pulse train is transmitted and received over a period of time such that the relative positioning of the pulses in time defines a channel used by the system to transmit information. These pulse trains or some combination of different pulse trains, repeat over time such that the minimum time value of a time period containing a pulse train occurs at the same time as the maximum time value of the preceding time period containing the preceding pulse train.

Time period(s) can be laid out in a multitude of ways to accommodate a wide variety of pulse transmission system applications. One approach involves a value range layout where a period of time is divided into smaller and smaller components. The division is used to achieve a desired component resolution in order to facilitate mapping of a code element value to a time position value that resides within a layout component, which corresponds to some range of time values.

Figure 1:
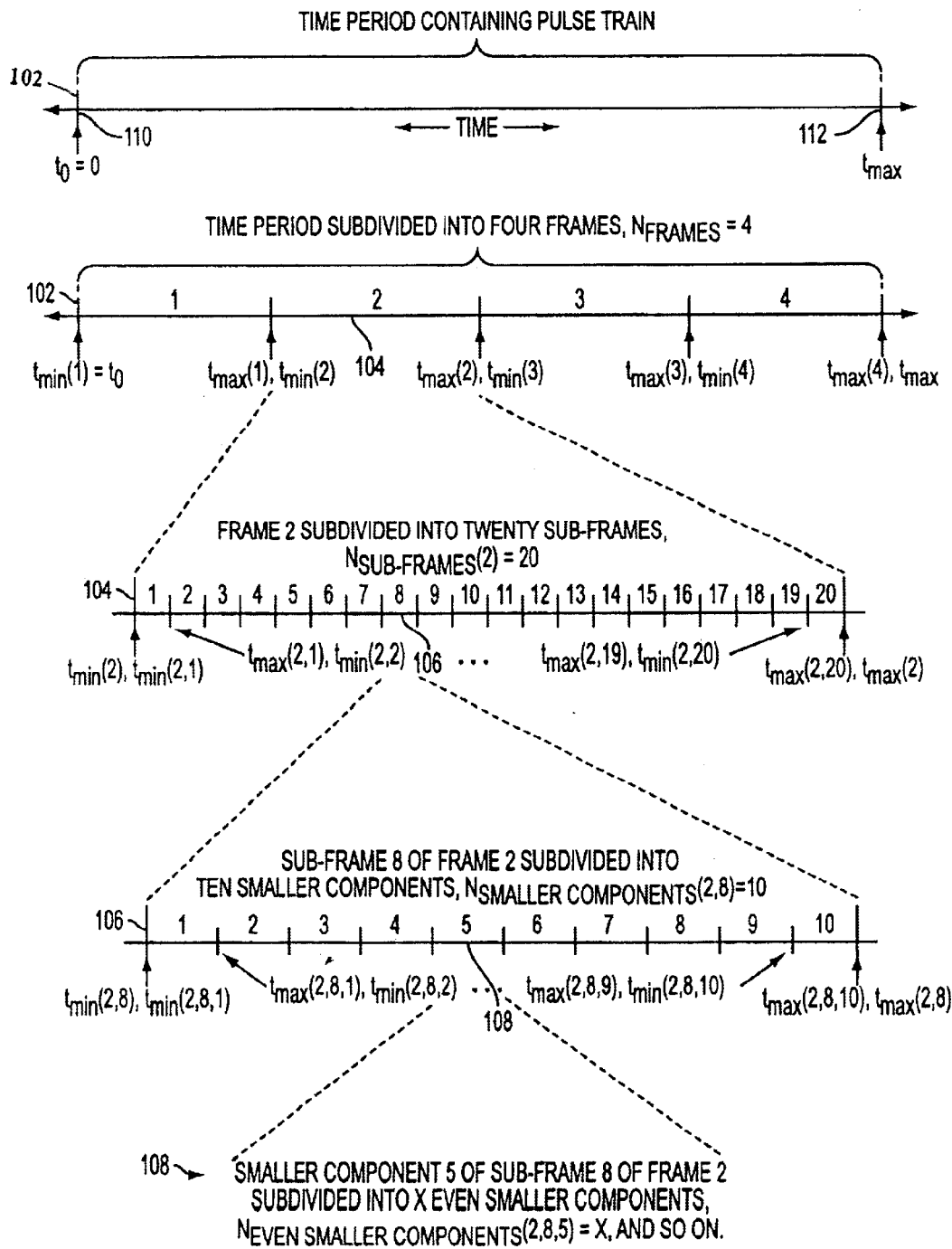
FIG. 1 illustrates a time period including exemplary time period layout parameters, and exemplary subdivisions of the time period including frames, sub-frames, smaller time period components, and even smaller time period components.

FIG. 1 includes a time period layout. As depicted in FIG. 1, a layout parameter, $t_{max}$, can be specified which defines the length of a time period, wherein the time period has a relative minimum time value 110 of $t=t_0=0$ and a relative maximum time value 112 of $t=t_{max}$. A second layout parameter, $N_{frames}$, can be specified to divide the time period layout 102 into one or more frames 104 of the same size or of different sizes with each frame n having a minimum time value, $t_{min}(n)$, and a maximum time value, $t_{max}(n)$, where n=1 to $N_{frames}$. Multiple frame sizes may be employed to accommodate multiple data stream systems, to add an encryption dimension, and/or for many other purposes. For example, one or more acquisition frames and/or one or more header frames can be intermixed with one or more frames containing user data, wherein the acquisition, header, and user data frames have different sizes. Alternatively, same size flames may be employed such that acquisition, header, and user data are combined into a single data stream that is deciphered via a communications protocol once the data stream is captured. The number and size of frames used in a given layout can also be tailored to meet specific application requirements. They can also be used to remain within system implementation limits, to achieve one or more of a variety of system characteristics in areas such as performance (i.e., bit rate), reliability (i.e., bit error rate), system-simplicity, ease-of-use, etc., and/or for many other reasons. When different sized frames are employed, minimum and maximum time values are specified for each frame n. The minimum time value for a given frame, $t_{min}(n)$, may equal the maximum time value of the preceding frame, $t_{max}(n-1)$, or $t_0$. The maximum time value of a given frame, $t_{max}(n)$, may equal the minimum time value for the following frame, $t_{min}(n+1)$, or $t_{max}$. When same sized frames are employed, the time period layout is evenly divided such that $t_{max}(n) - t_{min}(n)$ is equal for each frame n.

An array of layout parameters, $N_{sub\text{-}frames}(N_{frames})$, can be specified to subdivide frames 104 into sub-frames 106. For example, frames 104 may be subdivided into sub-frames 106 of the same or different sizes with each sub-frame m of frame n having a minimum time value, $t_{min}(n,m)$, and a maximum time value, $t_{max}(n,m)$, where n=1 to $N_{frames}$ and m=1 to $N_{sub\text{-}frames}(n)$. Multiple sub-frame sizes may be employed to accommodate multiple bit rates, to achieve desirable correlation properties, to add an encryption dimension, and/or for many other purposes. As with frames, the number and size of sub-frames for a given frame used in a given time period layout can also be tailored to meet specific application requirements. These parameters may also be selected to remain within system implementation limits, to achieve one or more of a variety of system characteristics in areas such as performance (i.e., bit rate), reliability (i.e., hit error rate), system-simplicity, ease-of-use, etc., and/or for many other reasons. When different sized sub-frames are employed, minimum and maximum time values are specified for each sub-frame m of each frame (n). The minimum time value for a given sub-frame, $t_{min}(n,m)$ may equal the maximum time value of the preceding sub-frame, $t_{max}(n,m-1)$, or the minimum time value of the frame in which the sub-frame resides, $t_{min}(n)$. The maximum time value of a given sub-frame, $t_{max}(m,n)$, may equal the minimum time value for the following sub-frame, $t_{min}(n,m+1)$, or the maximum time value of the frame in which the sub-frame resides, $t_{max}(n)$. When same sized sub-frames are employed, frames may be evenly divided. As a result, $t_{max}(n,m)-t_{min}(n,m)$ may be equal for each sub-frame m of a frame n or for all frames such that all sub-frames of a given frame are of the same size. The sub-frame sizes may vary from frame to frame or all sub-frames of all frames arc of the same size depending on the sizes of the frames and the numbers of sub-frames in the frames.

In a manner consistent with the subdivision of frames into sub-frames, additional multi-dimensional arrays of layout parameters can be used to further subdivide sub-frames 106 into smaller components 108 of the same or different sizes, ad infinitum. This subdivision may continue until a smallest desirable time component resolution is attained. The time components at each resolution level may have a minimum time value, $t_{min}(n,m, \ldots, \alpha)$, and a maximum time value, $t_{max}(n,m, \ldots, \alpha)$, where n=1 to $N_{frames}$, m=1 to $N_{sub\text{-}frames}(n), \ldots$, and $\alpha=1$ to $N_{smallest\ components}(n,m, \ldots)$. Such further subdivision of sub-frames into smaller and smaller time components enables systems with finer and finer tuning resolution and thus higher and higher fidelity, increases modulation timing accuracy, and can be useful for other purposes. As with frames and sub-frames, the number and size of these smaller time components can also be tailored to meet specific application requirements. These parameters can also be tailored to remain within system implementation limits, to achieve one or more of a variety of system characteristics in areas such as performance (i.e., bit rate), reliability (i.e., bit error rate), system-simplicity, ease-of-use, etc., and/or for many other reasons. When different sizes of these smaller time components are employed, minimum and maximum time values are specified for each time component ($\alpha$). The minimum time value for a component, $t_{min}(n,m, \ldots, \alpha)$, may be equal to the maximum time value of the preceding component, $t_{max}(n,m, \ldots, \alpha-1)$, or the minimum time value of the next higher-level time component in which the time component resides, $t_{min}(n,m, \ldots)$. The maximum time value of a given time component, $t_{max}(n,m, \ldots \alpha)$ may be equal to the minimum time value for the following component, $t_{min}(n,m, \ldots \alpha+1)$ or the maximum time value of the next higher level time component in which the time component resides, $t_{max}(n,m, \ldots)$. When same-sized smaller time components are employed, the next higher-level components may be evenly divided. Consequently, $t_{max}(n,m, \ldots \alpha)-t_{min}(n,m, \ldots \alpha)$ may be equal for each time component of a given next higher level component. For all next higher-level components, all time components of a given next higher-level component may be of the same or different size. Under one arrangement, the time component sizes may vary from next higher-level component to next higher-level component. Alternatively, all time components of all higher-level components may be of the same size, depending on the sizes of the next higher-level components and the numbers of time components in the next higher-level components.

At the top of FIG. 1 a time period layout 102 is depicted that is bounded by endpoints of $t_0$ 110 and $t_{max}$ 112. Beneath this illustration, an equivalent time period layout 102 is shown that has been subdivided into four frames 104 by setting the layout parameter $N_{frames}$ to a value of four (4). The size of each frame 104 is established by setting the minimum and maximum time values of each frame 104, $t_{min}(n)$ and $t_{max}(n)$, where n=1 to 4. An enlargement of the second frame 104 is then shown where the frame 104 is subdivided into twenty sub-frames 106 by setting the layout parameter $N_{sub\text{-}frames}(2)$ to a value of twenty (20). The size of each sub-frame 106 has been established by setting the minimum and maximum time values of the sub-frames 106 within frame two 104, $t_{min}(n,m)$ and $t_{max}(n,m)$, where n=2 and m=1 to 20. An enlargement of the eighth sub-frame 106 of frame two 104 is then shown. Under this embodiment, the sub-frame 106 is subdivided into ten smaller time components 108 by setting the layout parameter $N_{smaller\_components}(2,8)$ to a value of ten (10). The size of each smaller time component 108 is established by setting the minimum and maximum time values of the smaller components 108 within sub-frame eight 106 of frame two 104, $t_{min}(n,m,l)$ and $t_{max}(n,m,l)$, where n=2, m=8, and l=1 to 10.

It is then shown that these smaller time components 108 could be subdivided into X even smaller time components (whose size is not shown) using another layout parameter [e.g., $N_{even\_smaller\_components}(2,8,5)=X$], which can be further subdivided ad infinitum. Not shown in the figure are the enlargements of the other frames 104, sub-frames 106, and smaller time components 108, which for this example would also contain twenty sub-frames 106, ten smaller time components 108, and X even smaller time components, respectively.

Figure 2A:
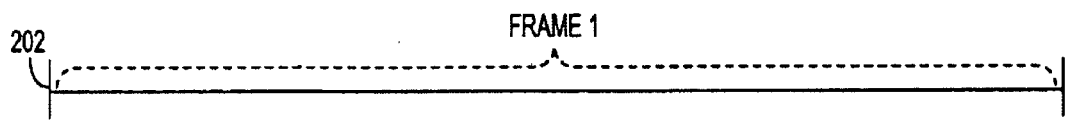
FIG. 2a illustrates a time period layout including an exemplary frame.

By subdividing a time period layout into levels of smaller and smaller components and by varying or not varying the size of components at different levels, a multitude of different layout permutations can be defined. FIGS. 2a through 2o provide examples of different types of time period layouts that can be established. This group of figures illustrates layout permutations involving nesting of up to three levels of time components, which could be subdivided further to additional levels, ad infinitum, to produce additional permutations.

FIG. 2a depicts an exemplary embodiment of a time period layout 202 consisting of a single frame (not labeled).

Figure 2B:
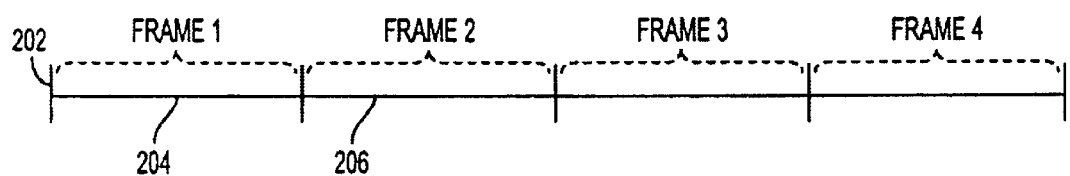
FIG. 2b illustrates a time period layout including multiple frames of the same size.
Figure 2C:
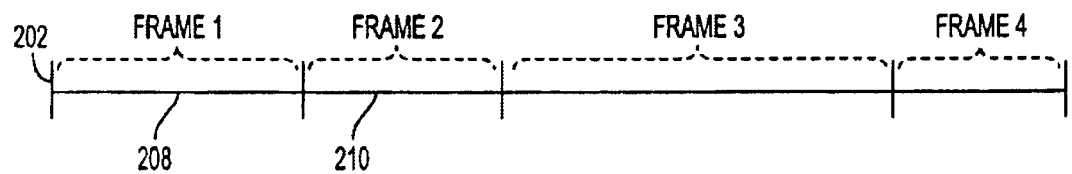
FIG. 2c illustrates a time period layout including multiple frames of different sizes.

FIGS. 2b and 2c present exemplary embodiments of time period layouts 202 that consist of multiple frames of the same size 204, 206 and of different sizes 208, 210, respectively. Specifically, in FIG. 2b, frame 1 204 is shown to be the same size as frame 2 206. In FIG. 2c, frame 1 208 is shown as a different size than frame 2 210. It will be apparent to those skilled in the art that other frame size configurations are possible, such as, e.g., a subset of frames being the same size and another subset of frames being of a different size, and that the exact relative frame size illustrations are intended to be illustrative, but not limiting.

Figure 2D:
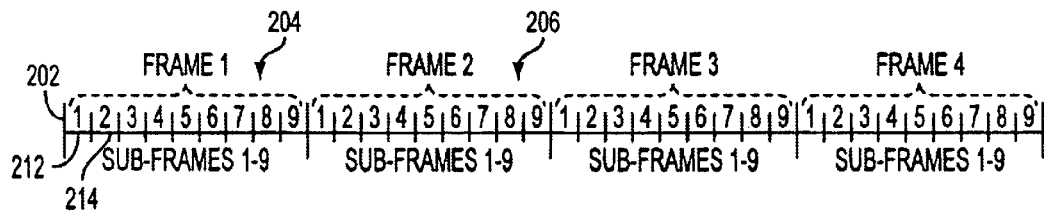
FIG. 2d illustrates a time period layout including multiple frames of the same size that are each subdivided into sub-frames of the same size.
Figure 2E:
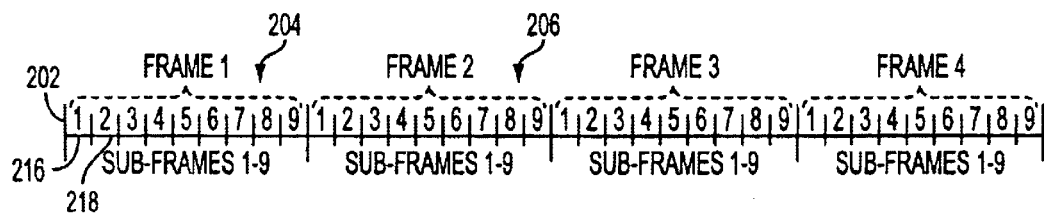
FIG. 2e illustrates a time period layout including multiple frames of the same size that are each subdivided into sub-frames of different sizes.

FIGS. 2d and 2e illustrate exemplary embodiments of time period layouts 202 consisting of multiple frames of the same size 204, 206 that are each subdivided into sub-frames of the same size 212, 214 or of different sizes 216, 218, respectively. Specifically, in FIG. 2d, frame 1 204 is the same size as frame 2 206, and the sub-frames 212, 214 of frame 1 204 are of the same size. In FIG. 2e, again frame 1 204 is of the same size than frame 2 206, but sub-frames 216, 218 of frame 1 204 are of different sizes.

Figure 2F:
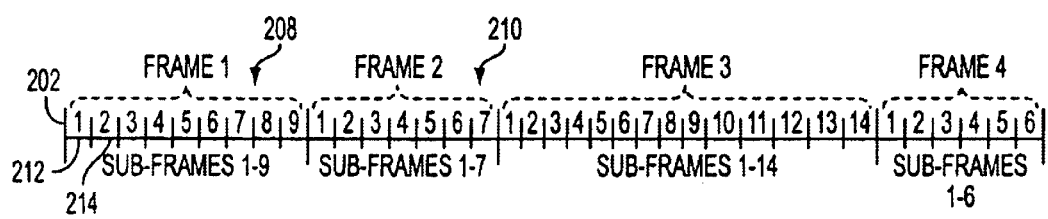
FIG. 2f illustrates a time period layout including multiple frames of different sizes that are each subdivided into sub-frames of the same size.
Figure 2G:
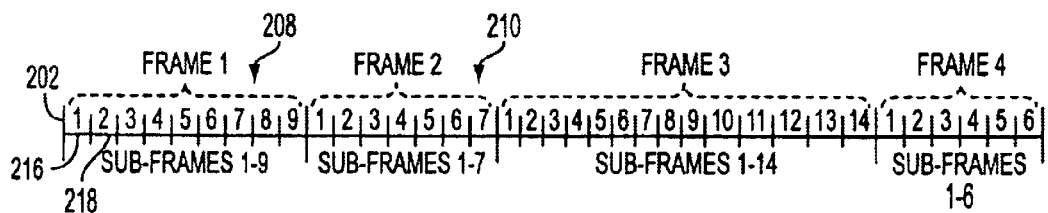
FIG. 2g illustrates a time period layout including multiple frames of different sizes that are each subdivided into sub-frames of different sizes.

Similarly, FIGS. 2f and 2g illustrate time period layouts 202 consisting of multiple frames of different sizes 208, 210 that are each subdivided into sub-frames of the same size 212, 214 or of different sizes 216, 218, respectively. Specifically, in FIG. 2f, frame 1 208 is of a different size than frame 2 210, and the sub-frames 212, 214 of frame 1 208 are of the same size. In FIG. 2g, again frame 1 208 is of a different size than frame 2 210, but sub-frames 216, 218 of frame 1 208 are of different sizes.

Adding another level of component subdivision and varying whether or not component size remains constant produce an additional eight layout permutations, as shown in FIGS. 2h through 2o.

Figure 2H:
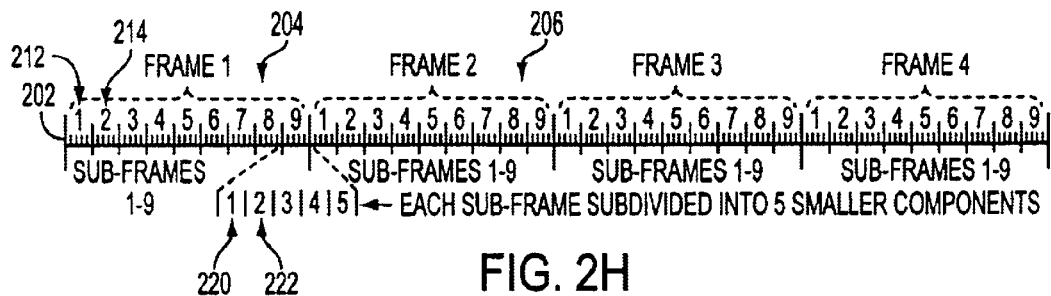
FIG. 2h illustrates a time period layout including multiple same-size frames and same-size sub-frames combined with smaller components of the same size.
Figure 2I:
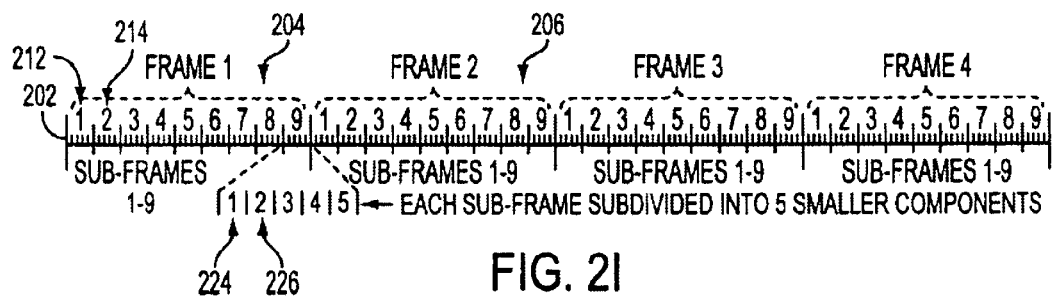
FIG. 2i illustrates a time period layout including multiple same-size frames and same-size sub-frames combined with smaller components of different sizes.

In FIGS. 2h and 2i same-size frames 204, 206 and same-size sub-frames 212, 214 are combined with smaller components of the same size 220, 222 and of different sizes 224, 226, respectively. At the frame level (204, 206) and at the sub-frame level (212, 214), FIGS. 2h and 2i are the same. However, the sub-frames of FIG. 2h have smaller components 220, 222 that are of the same size, whereas the sub-frame of FIG. 2i have smaller components 224, 226 that are of different sizes.

Figure 2J:
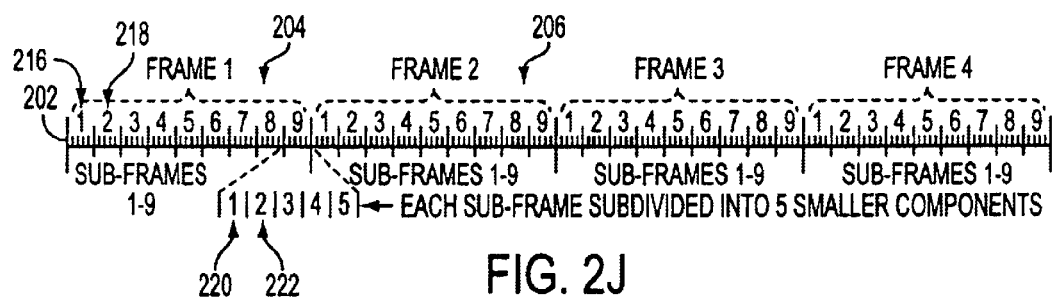
FIG. 2j illustrates a time period layout including multiple same-size frames and different-size sub-frames combined with smaller components of the same size.
Figure 2K:
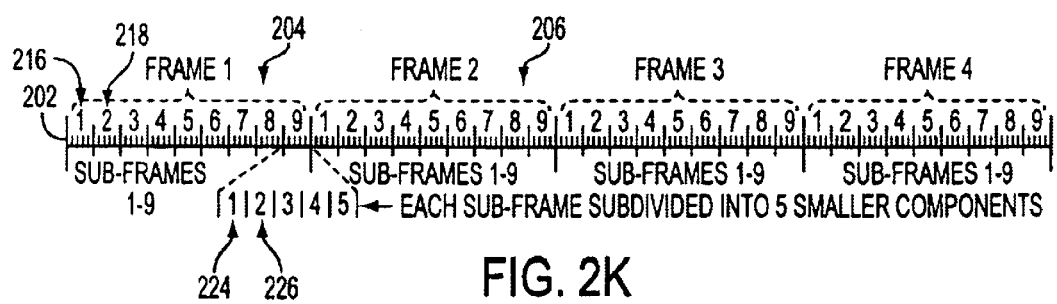
FIG. 2k illustrates a time period layout including multiple same-size frames and different-size sub-frames combined with smaller components of different sizes.

In FIGS. 2j and 2k same-size frames 204, 206 and different-size sub-frames 216, 218 are combined with smaller components of the same size 220, 222 and of different sizes 224, 226, respectively. At the frame level (204, 206) and at the sub-frame level (216, 218), FIGS. 2j and 2k are the same. However, the sub-frames of FIG. 2j have smaller components 220, 222 that are of the same size, whereas the sub-frames of FIG. 2k have smaller components 224, 226 that are of different sizes.

Figure 2L:
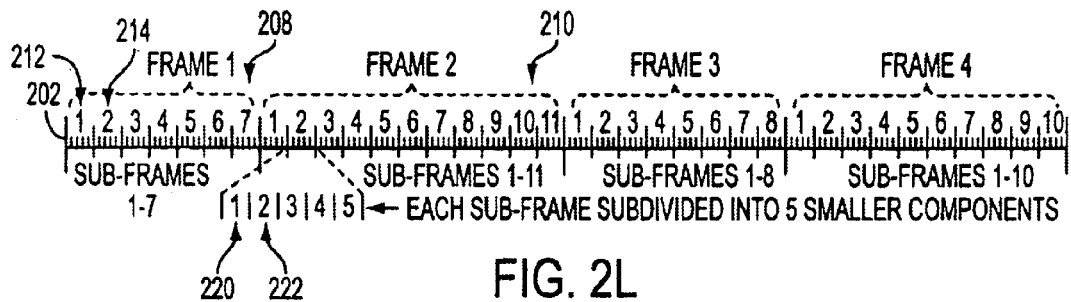
FIG. 2l illustrates a time period layout including multiple different-size frames and same-size sub-frames combined with smaller components of the same size.
Figure 2M:
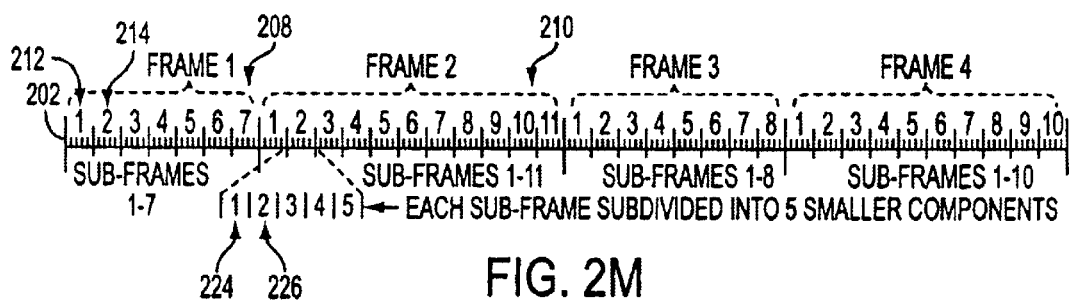
FIG. 2m illustrates a time period layout including multiple different-size frames and same-size sub-frames combined with smaller components of different sizes.

In FIGS. 2l and 2m different-size frames 208, 210 and same-size sub-frames 212, 214 are combined with smaller components of the same size 220, 222 and of different sizes 224, 226, respectively At the frame level (208, 210) and at the sub-frame level (212, 214), FIGS. 2l and 2m are the same. However, the sub-frames of FIG. 2l have smaller components 220, 222 that are of the same size, whereas the sub-frames of FIG. 2m have smaller components 224 226 that are of different sizes.

Figure 2N:
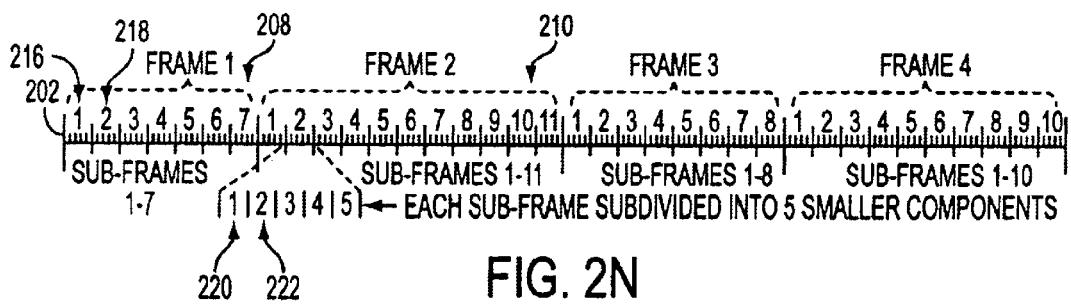
FIG. 2n illustrates a time period layout including multiple different-size frames and different-size sub-frames combined with smaller components of the same size.
Figure 2O:
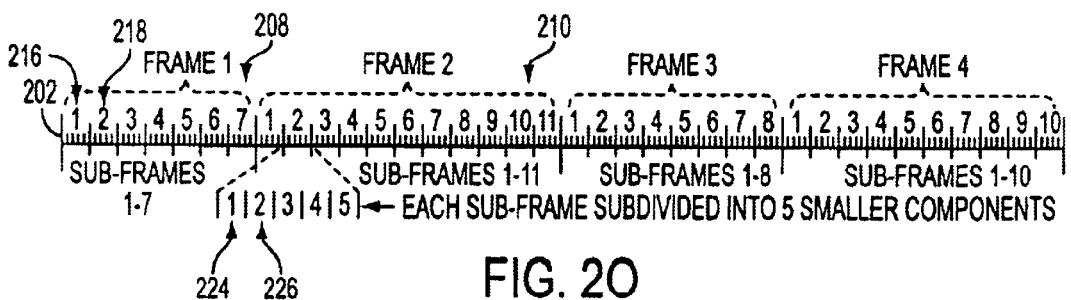
FIG. 2o illustrates a time period layout including multiple different-size frames and different-size sub-frames are combined with smaller components of different sizes.

In FIGS. 2n and 2o different-size frames 208, 210 and different-size sub-frames 216, 218 are combined with smaller components of the same size 220, 222 and of different sizes 224, 226, respectively. At the frame level (208, 210) and at the sub-frame level (216, 218), FIGS. 2n and 2o are the same. However, the sub-frames of FIG. 2n have smaller components 224, 226 that arc of the same size, whereas the sub-frames of FIG. 2o have smaller components 224, 226 that are of different sizes.

Although a number of variations for the frames, sub-frames, and smaller components are illustrated, those skilled in the art will appreciate that the process of breaking down components into finer and finer levels of granularity, ad infinitum, is possible, meaning that smaller components can be further broken down, and so on, and that any conceivable combination of same and different size components is possible.

Another approach to defining a time layout is to specify discrete time position values to which individual code elements can map. With this approach, code elements map to an exact time position instead of a range of time bounded by frame, sub-frame, or smaller time period component minimum and maximum time values.

Non-Fixed Time Layouts

A time period layout can also be defined as a non-fixed layout, which is also referred to as a delta value layout. Whereas a 'fixed' layout defines a range of time values between $t_0$ and $t_{max}$, a 'non-fixed' time period layout defines a range of delta time values between $\Delta t_0$ and $\Delta t_{max}$. The delta time value range can be divided into frames, sub-frames, and smaller components in the same manner as a fixed time period layout. This non-fixed layout approach depends on the time position of the previous pulse in that the time position of a given pulse equals the time position of the previous pulse plus a delta value determined by mapping a code element value to a non-fixed time layout.

Exemplary embodiments of delta value layouts arc described in a co-pending patent application entitled "A METHOD AND APPARATUS FOR MAPPING PULSES TO A NON-FIXED LAYOUT" that is being filed concurrently with the instant application and which is hereby incorporated by reference.

Code Mapping Approaches

A multitude of code mapping approaches can be employed in conjunction with a given time period layout to accommodate pulse transmission system implementation requirements and to optimize system performance for specific applications. A time-hopping code is comprised of elements having either integer or floating-point values. As a minimum, these values map pulses to specific time positions within the defined layout. A given frame, sub-frame, or smaller time period component can contain zero, one, or more pulses, and the value of each integer code element or the non-fractional part of each floating-point code element value identifies a frame, sub-frame or smaller time period component in which a pulse may be placed. A time-hopping code can also contain additional elements used to specify other pulse characteristics such as amplitude, width, type and/or whether a pulse should be inverted. Additionally, a number within a code can be a single element value or can represent a combination of multiple element values.

The numbering scheme used for a code must be consistent with the numbering scheme used for the defined time period layout to allow mapping of code element values to positions within time period components. Components may be numbered beginning with zero, one, or with any other number. Components produced by subdividing higher level components, such as sub-frames or smaller time period components, may be numbered per higher level component such that sub-component numbering begins again with each higher level component, or may be numbered in sequence independent of the higher level component in which they reside.

Once an integer value or non-fractional part of a floating-point value has been used to map a pulse in time, an established offset value can be used to specify the exact position of the pulse within the frame, sub-frame, or smaller time period component. An absolute offset value can be used to position pulses a common distance in time from the minimum time values of the frames, sub-frames, or smaller time period components to which code elements are mapped. Alternatively, a relative position offset value can be used to position pulses a fraction of the distance in time between the minimum and maximum time values of the frames, sub-frames, or smaller time period components to which code elements are mapped. For floating-point codes, the fractional part of each floating-point code element can be used. The fractional part could specify the relative offset used to position a pulse a fraction of the distance in time between the minimum and maximum time values of the frame, sub-frame, or smaller time component to which the non-fractional part of the floating-point code element is mapped. Unlike integer codes, where an absolute or relative offset value may be used to position pulses, the fractional portions of floating-point values can vary per code element allowing each pulse position to be established independent of other pulses.

Figure 3A:
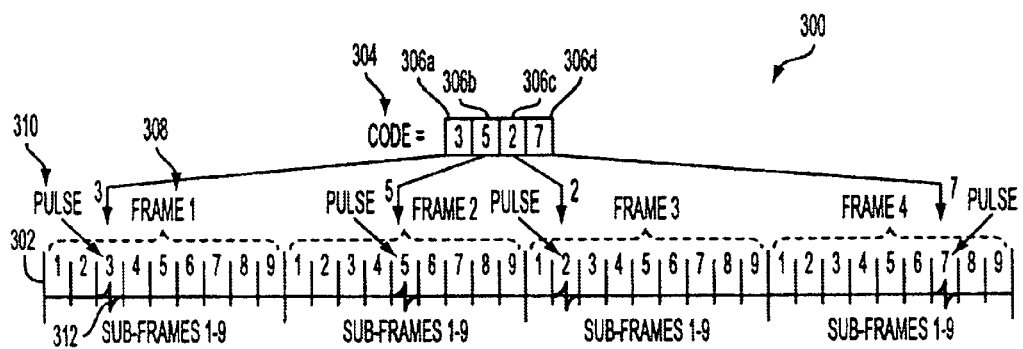
FIG. 3a illustrates a code mapping approach, depicting pulses mapped to sub-frames based on integer code element values of a time-hopping code, where an integer code element exists per frame and pulses are positioned within sub-frames using an absolute or relative position offset.
Figure 3B:
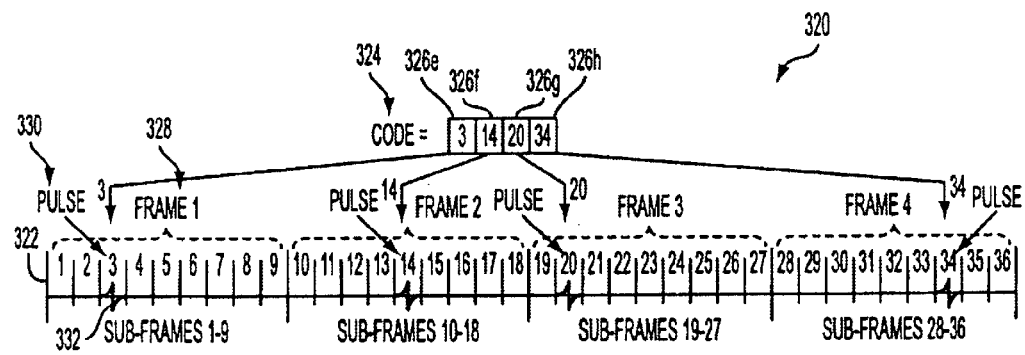
FIG. 3b illustrates a code mapping approach, depicting pulses mapped to sub-frames that are numbered in sequence across a time period, where integer code element values of a time-hopping code map to the sequentially numbered sub-frames.

FIGS. 3a and 3b illustrate exemplary embodiments of the component numbering and code mapping approaches involving integer code element values. FIG. 3a depicts a diagram 300 of an exemplary embodiment illustrating pulses 310 mapped to sub-frames 312 numbered per frame 308, where an integer code element 306a–306d of a code 304 exists per frame 308 of a layout 302. FIG. 3b shows a diagram 320 of an exemplary embodiment illustrating pulses 330 napped to sub-frames 332 that are numbered in sequence across the time period layout 322 independent of frames 328, where an integer code element 326e–326h of a code 324 exists per pulse.

In FIGS. 3a and 3b, the exact positions of the pulses 310, 330 within the sub-frames 312, 332 specified by the two integer codes 304, 324 would be determined using either an absolute or relative position offset value. It should be noted that the two figures present two different methods for mapping codes to the same locations in the time period. The first sub-frame numbering method is frame-dependent in that it maps one pulse and only one pulse per frame, while the second sub-frame numbering method is frame-independent in that it can be used to map zero, one, or more pulses to a given frame.

Figure 4A:
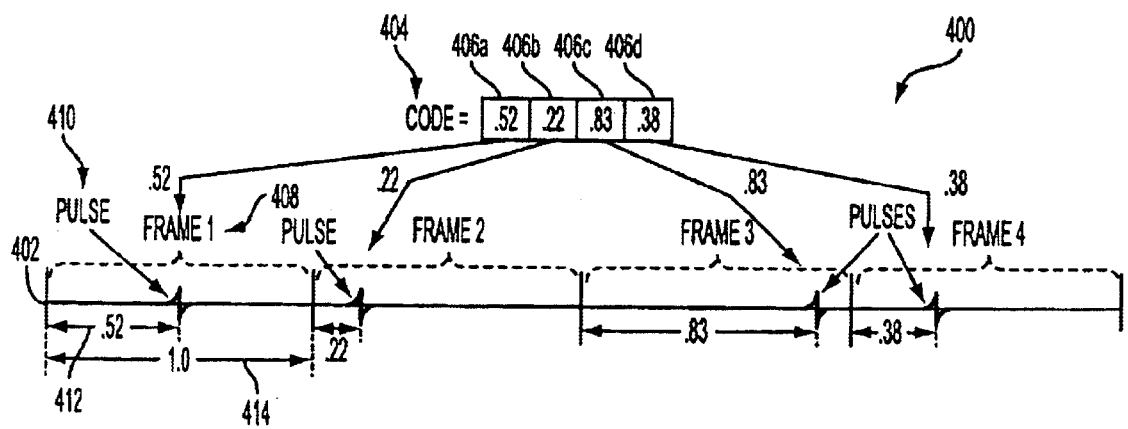
FIG. 4a illustrates mapping pulses to positions within frames based on floating-point code element values of a time-hopping code, where a floating-point code element exists per frame.
Figure 4B:
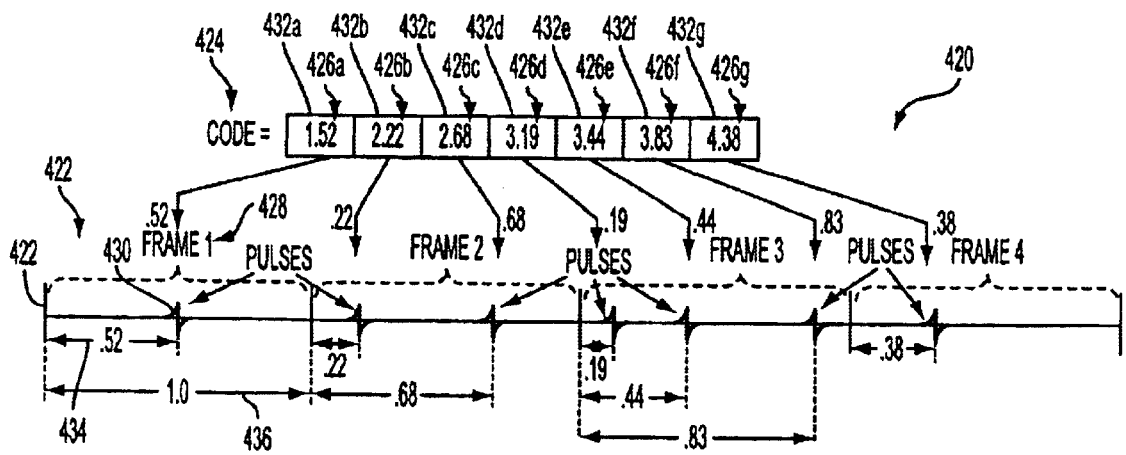
FIG. 4b illustrates mapping pulses to frames within a time period using the non-fractional part of a floating point code element value of a time-hopping code and mapping pulses to positions within frames using the fractional part of the floating-point code element values.

FIGS. 4a and 4b depict two exemplary embodiments of the invention illustrating methods of mapping pulses to frames using floating-point values.

In FIG. 4a, each floating-point code element value 406a–406d of a code 404 maps a pulse 410 to a location that is a relative fraction 412 of the distance in time 414 between the minimum and maximum time values of each frame 408 within a time layout 402, as defined by a fractional part of a code element value.

In FIG. 4b, the fractional part of each floating-point code element value 426a–426g of a code 424 maps a pulse 430 to a position that is a fraction 434 of the distance in time 436 between the minimum and time values of the frame 428 within a time layout 422, as specified by the non-fractional part of the floating-code element value 432a–432g of the code 424. For both of these floating-point code methods, pulses are positioned independent of each other. In a manner similar to the two integer code examples, the first floating-point code method is frame-dependent such that it positions one pulse and only one pulse per frame, while the second method is frame-independent enabling zero, one or more pulses to be positioned per frame. These component numbering and code mapping approaches may be applied at any component level defined for a time period.

A bit-group mapping approach can also be employed to map code elements to positions within a time period layout. With this approach a time component and a position offset can be specified by subdividing the binary representation of a code element value. The binary representation may be divided into a plurality of subset of one or more bits. For example, in a simple form, the binary representation may be divided into a first sub set of bits, for example, the most significant bits (MSBs) and a second subset of bits, for example, the least significant bits (LSBs). Under this arrangement, the first subset of bits may specify the time period component in which to place a pulse and the second subset of bits specifies an absolute or relative position offset value.

Figure 5A:
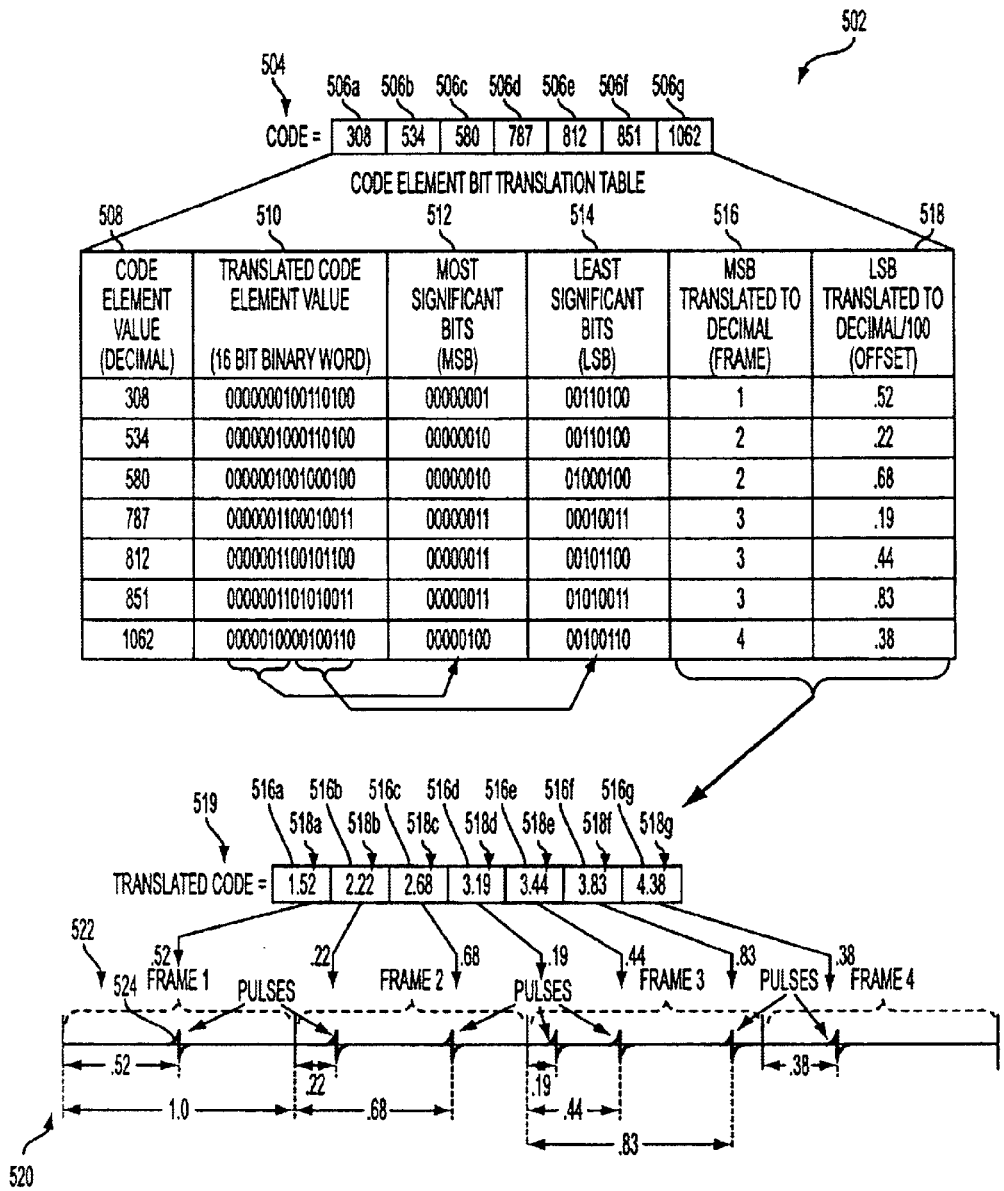
FIG. 5a illustrates an exemplary embodiment of a least significant bit/most significant bit (LSB/MSB) mapping approach.

An example of a LSB/MSB mapping approach is shown in FIG. 5a. In the example the decimal value 508 of each code element value 506a–506g of a code 504 is represented as a 16-bit binary word 510 that is subdivided into its eight MSBs 512 and its eight LSBs 514. The binary value of the MSBs is translated into a decimal value 516 representing the frame 522 in which to place a pulse 524. The binary value of the LSBs is translated into a decimal value that is then divided by 100 in order to produce a value representing the desired offset fraction 518 used to specify the exact position of a pulse 524 within the frame 522 specified by the translated MSBs 516. The translated MSB and LSB values 516, 518 of each code element 506a–506g can also be combined into translated code elements (516a–516g and 518a–518g) that are equivalent to the code elements shown in FIG. 4b.

Figure 5B:
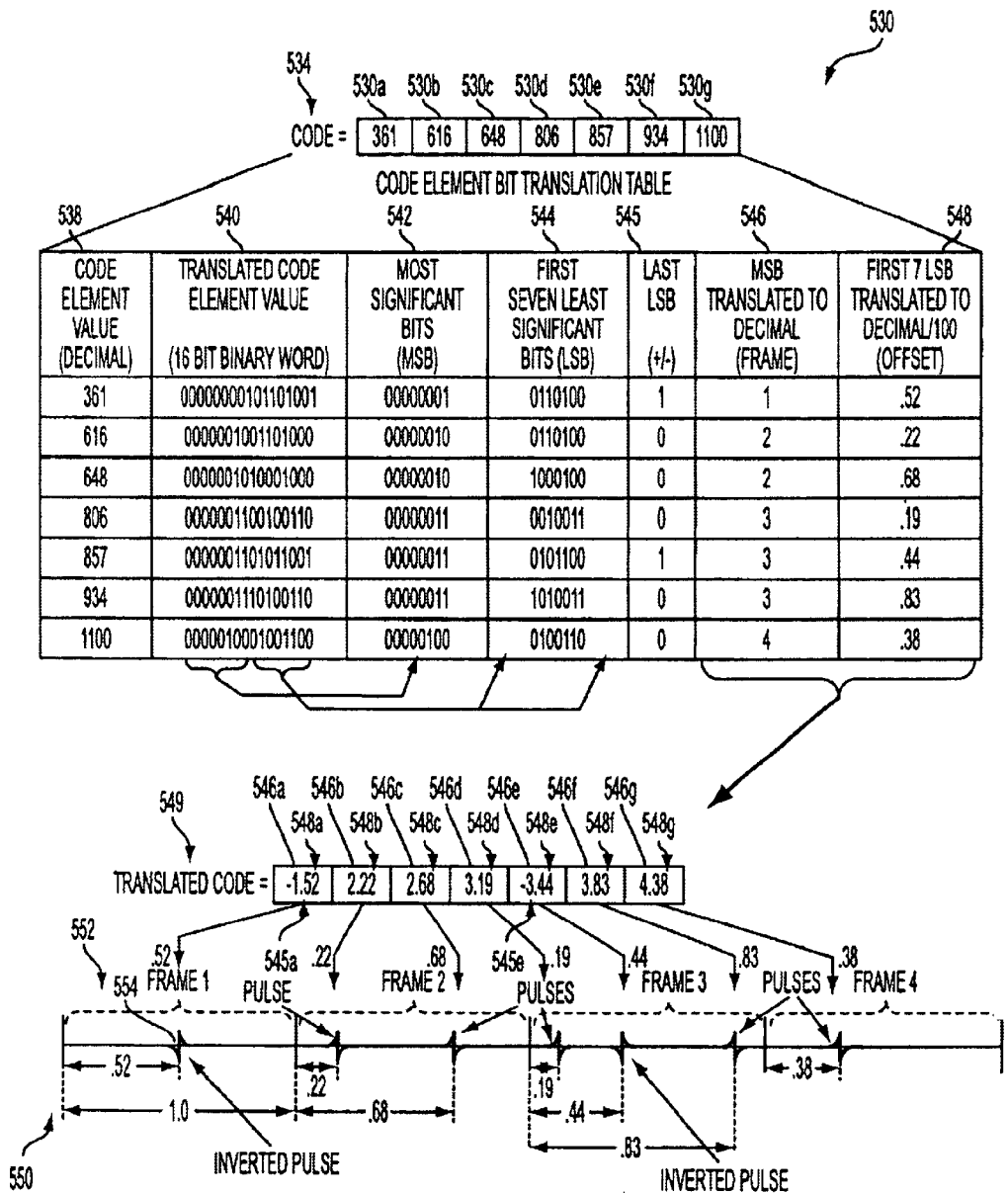
FIG. 5b illustrates another exemplary embodiment of a least significant bit/most significant bit (LSB/MSB) mapping approach.

The bits of a code elements binary representation can also be subdivided into three or more subsets to enable-encoding of additional information such as whether or not a pulse is inverted, pulse amplitude, pulse width, pulse type, etc. FIG. 5b is similar to FIG. 5a except that it demonstrates a slightly more complex bit-group mapping approach. In the example the decimal value 538 of each code element value 536a–536g of a code 534 is represented as a 16-bit binary word 540 that is subdivided into its eight MSBs 542, its first seven LSBs 544, and its last LSB 545. The binary value of the MSBs is translated into a decimal value 546 representing the frame 552 in which to place a pulse 554. The binary value of the first seven LSBs is translated into a decimal value that is then divided by 100 in order to produce a value representing the desired offset fraction 548 used to specify the exact position of a pulse 554 within the frame 552 specified by the translated MSBs 546. The translated MSB and LSB values 545, 546, 548 of each code element 536a–536g can also be combined into translated code elements (545a–545g, 546a–546g and 548a–548g), where the first seven LSBs 544 are used to specify the offset fraction 548 and the last LSB 545 is used to specify whether or not a pulse is inverted. The translated bit patterns are shown combined into a translated code 549 that is the same as the translated code 519 shown in FIG. 5a, except the first and fifth code element values are negative 545*a*, 545*e* to specify that the first and fifth pulses are to be inverted.

Bit-group mapping may be employed using binary word sizes that are 8-bit, 16-bit, and 32-bit or whatever size is deemed appropriate to encode data describing a pulse train. Given a word size, bits can be grouped as appropriate to encode the largest possible value for a given data item. For example, to encode offset fraction values with 2-digit precision, a group of 7 data bits is required to represent integer values from 0 to 100. Similarly, if 1000 frames exist in the time period, a group of 10 bits is required to represent integer values from 1 to 1000.

The bit-group mapping method can also be employed in combination with established absolute or relative offset values when common offset positions are appropriate.

Numerical Code Generation

After the time period layout and code mapping approach have been established, a time-hopping code is generated using a numerical code generation technique. For certain pulse transmission system applications such as communications, the autocorrelation and cross-correlation properties of a pulse train must be within certain limits to ensure proper signal locking and channelization. In such cases, a code can be generated using a quadratic congruential, hyperbolic congruential, linear congruential, Costas array or other such numerical code generation technique designed to generate codes guaranteed to have specific correlation properties.

A quadratic congruential code of integer values can be generated using an equation of the general form:

$$y_{i,\alpha,\beta}^{QC}(k) \equiv [i(k+\alpha)^2 + \beta] \bmod p$$

$k=0, 1, \ldots, p-1; i=\{1, 2, \ldots, p-1\}; \alpha; \beta \in \{0, 1, \ldots, p-1\}$, where p is a prime number. Each quadratic congruential code has p elements and $p^3-p^2$ different sequences can be generated by changing the value of parameters i, $\alpha$, and , $\beta$. Quadratic congruential codes have correlation properties that guarantee a maximum of two coincidences when auto-correlated with some time offset and a maximum of four coincidences when cross-correlated with another quadratic congruential code.

A hyperbolic congruential code of integer values can be generated using an equation of the general form:

$$y_i^{HC}(k) = (ik^{-1}) \bmod p$$

$1 \leq i, k \leq p-1$, where p is a prime number $\geq 2$ and $k^{-1}$ is the unique inverse of k modulo p. Each hyperbolic congruential code has p-1 elements and p-1 different sequences can be generated. Hyperbolic congruential codes have correlation properties that guarantee a maximum of two coincidences when auto-correlated with some time offset and a maximum of two coincidences when cross-correlated with another hyperbolic congruential code.

A linear congruential code of integer values can be generated using an equation of the general form:

$$y_{i,\beta}^{LC}(k) \equiv (ik + \beta) \bmod p$$

$1 \leq i, k \leq p-1; \beta \in \{0, 1, \ldots, p-1\}$, where p is a prime number. Each linear congruential code has p-1 elements and p-1 different sequences can be generated. Linear congruential codes have correlation properties that guarantee a maximum of 1/ln(p-1) coincidences when autocorrelated with some time offset and a maximum of 2/(p-1) coincidences when cross-correlated with another linear congruential code.

A Costas Array code of integer values can be generated by Welch construction using an equation of the general form:

$$y_{R,i,\alpha,\beta}^{WC}(k) \equiv (iR^{(k+\alpha)} + \beta) \bmod p$$

$k+\alpha=1, \ldots p-1; i \in \{1, 2, \ldots, p-1\}; \alpha\beta \in \{0, 1, \ldots, p-1\}$, where p is a prime number and R is a primitive element of p. Each Welch-Costas code has p-1 elements and $p^2$ different sequences can be generated. Welch-Costas codes have correlation properties that guarantee a maximum of one coincidence when autocorrelated with some time offset and a maximum of 1 coincidences when cross-correlated with another Welch-Costas code, where $R_1 = R_2^l$.

A Costas Array code of integer values can also be generated by Golomb construction using an equation of the general form:

$$y_{\eta,i,\alpha,\beta}^{GC}(k) \equiv (\log_\eta(1 - \alpha^{(i-k)}) + \beta) \bmod p$$

$k=1, \ldots, p-2; i \in \{1, 2, \ldots, p-2\}; \alpha\beta \in \{0, 1, \ldots, p-1\}$, where p is a prime number and $\eta$ is a primitive element of p. Each Golumb-Costas code has p-2 elements and $(p-1)^2$ different sequences can be generated. Golumb-Costas codes have correlation properties that guarantee a maximum of one coincidence when autocorrelated with some time offset and a maximum of 1 and m coincidences when cross-correlated with another Welch-Costas code, where $\eta_1 = \eta_2^m$ and $\alpha_1 = \alpha_2^l$.

Each of these alternative code generation schemes has corresponding characteristics to be considered in relation to the application of the pulse transmission system employing the code. For example, Costas codes have nearly ideal autocorrelation properties but somewhat less than ideal cross-correlation properties, while linear congruential codes have nearly ideal cross-correlation properties but less than ideal autocorrelation properties. In some cases, design tradeoffs require that a compromise between two or more code generation schemes be made such that a code is generated using a combination of two or more methods. An example of such a compromise is an extended quadratic congruential code generation approach that uses two independent operators, where the first operator is linear and the second operator is quadratic. Accordingly, one, two, or more code generation schemes or combinations of such schemes can be employed to generate a code without departing from the scope of the invention.

Alternatively, when correlation properties of the pulse train can be more loosely controlled, such as in a radar application, a pseudorandom code can be generated using a computers random number generator, binary shift-register(s)

mapped to binary words, a chaotic code generation scheme, or another well known technique. Such 'random-like' codes are attractive for certain applications since they tend to spread spectral energy over multiple frequencies while having 'good enough' correlation properties, whereas designed codes may have superior correlation properties but have spectral properties that may not be as suitable for a given application. Truly random numbers are serially uncorrelated such that any subsequence of numbers cannot be correlated with any other subsequence of numbers, may not repeat, and are uniform and unbiased. Pseudorandom codes exhibit the appearance of true randomness, but nevertheless have a specific number pattern that repeats after some period.

Computer random number generator functions commonly employ the linear congruential generation (LCG) method, which generates the n-th random number, $X_n$, from the previous random number, $X_{n-1}$, using an equation of the general form:

$$X_n = Ax_{n-1} + c (\mod m)$$

where n identifies a given code in the generated code sequence, and the generated sequence is characterized by the multiplier A, the additive constant c, the modulus m, and an initial seed $x_0$. These random number generator functions can be referred to as $LCG(a,c,m,x_0)$, which determines the sequence generated.

Another method used for computer random number generator functions is the Additive Lagged-Fibonacci Generator (ALFG) method. This approach can be described by an equation of the form:

$$x_n = x_{n-j} + x_{n-k} (\mod 2^m), j<k$$

where n identifies a given code in the generated code sequence, and j and k represent offsets to previously generated codes. The period of these generators is $(2^k-1)2^{m-1}$ and they are referred to as $ALFG(l,k,m,x_0)$, which determines the sequence generated.

Figure 6A:
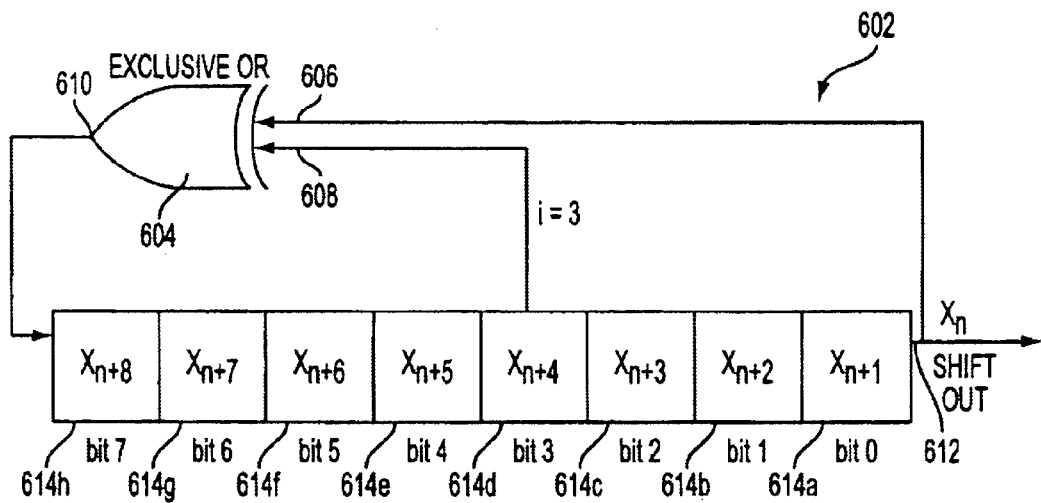
FIG. 6a is a diagram of a binary linear feedback shift-register pseudorandom number generator.

Binary shift-register pseudorandom number generators can be implemented in many different ways. In an exemplary embodiment, a linear feedback shift register as illustrated in FIG. 6a, can be used. FIG. 6a illustratively depicts a block diagram 602 including an exemplary embodiment of an LCG linear feedback shift register, including exclusive OR logic gate 604 having two inputs 606, 608 and one output 610. Eight bit shift register 614 (labeled bit 0 614a through bit 7 614h) includes shift out output 612 coupled to input 606 of exclusive OR logic gate 604. Bit 3 614d is coupled to input 608 of exclusive OR logic gate 604, and output 610 of exclusive OR logic gate 604 is coupled as shown to bit 7 614h. The linear feedback shift register can be described by an equation of the form:

$$x_{n+k} = \sum_{i=0}^{k-1} a_i x_{n+i} (\mod 2)$$

where n identifies a given code in the generated code sequence, k is the number of bits in the shift register, $a_i$ is the value of the i-th bit in the shift register. The sequence of bits that is generated depends on the initial shift-register state and which shift-register bit value 614d, $a_i$, is fed back into the exclusive-OR device 604 along with the shifted output 612.

Figure 6B:
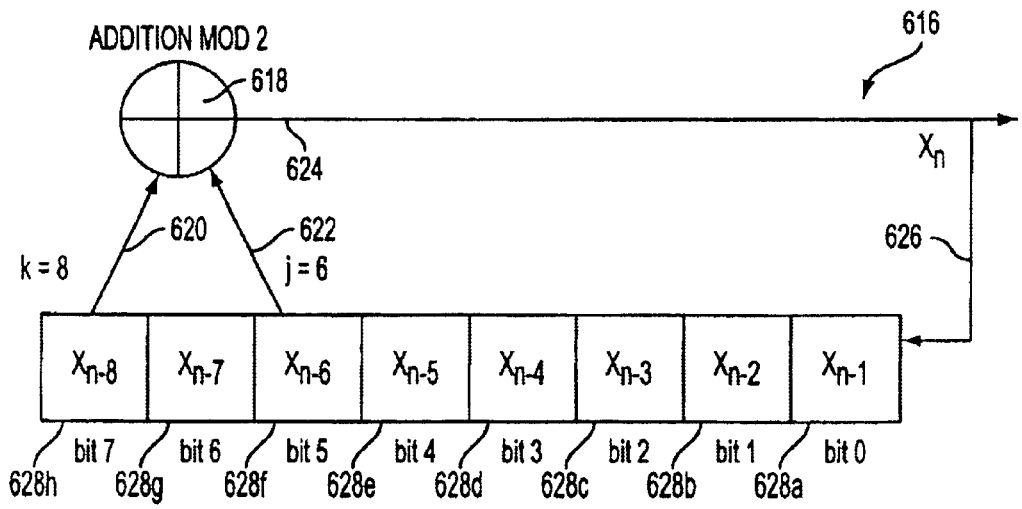
FIG. 6b is a diagram of an additive Lagged-Fibonacci shift register pseudorandom number generator.

The ALFG method can also be implemented using a shift register and a modulo adder device 618, as shown in FIG. 6b. FIG. 6b depicts diagram 616 including an eight-bit shift register having bit 0 628a through bit 7 628h. Diagram 616 also includes addition modulo 2 device 618 having two inputs 620 (coupled to bit 7 628h) and 622 (coupled to bit 5 628f), and an output 624 which can be outputted and can be fed back into input 626 of the ALFG shift register at bit 0 628a. The ALFG shift register can be described by an equation of the form:

$$x_n = x_{n-j} + x_{n-k} (\mod 2), j<k$$

where n identifies a given code in the generated code sequence, and j and k represent the shift-register bits 628h, 628f fed into the modulo adder device 618.

Many other different but related traditional approaches for generating pseudorandom code sequences can also be employed, comprising inversive congruential generators, explicit-inversive congruential generators, multiple recursive generators, and combined LCGs. Any of these or other similar traditional methods can be used to generate a pseudorandom code without departing from the scope of the invention.

In addition to the more traditional approaches described for generating pseudorandom codes, several other non-traditional approaches can be employed including chaotic code generators and Optimal Golomb Ruler (OGR) code generators. Any of these or other non-traditional methods can also be used to generate a pseudorandom code without departing from the scope of the invention.

Different methods of generating pseudorandom codes vary in the degree to which they approach true randomness. Additionally, variables, such as random number function seed values and initial states of shift-registers, determine where in the repeating number pattern that a given pseudorandom number or subsequence of numbers is retrieved. Consequently, the correlation and uniformity properties of a given generated pseudorandom code sequence can be difficult to predict and guarantee.

Mapping Code Elements to Pulse Positions

According to one of the features of the present invention, a pulse may be mapped or positioned anywhere within a time frame, subframe or other time component. In other words, the present invention applies to situations where no non-allowable region is specified within a layout. After a code has been generated using a numerical code generation technique, the code element values are mapped to specific pulse positions in time per the defined time period layout and the employed code mapping approach. The mathematics behind the numerical code generation techniques assumes the components to which generated code element values are mapped form a contiguous configuration of same-sized components. As a result, codes may be mapped to any position within the components. The component configuration repeats such that the first component of a given component configuration is contiguous with the last component of the preceding component configuration and the last component of a component configuration is contiguous with the first component of the next component configuration. These assumptions account for the wrapping of a code when a reference point is shifted and greatly simplify correlation property calculations pertaining to coincidences that can occur when components of two correlated codes are offset by some amount.

Figure 7:
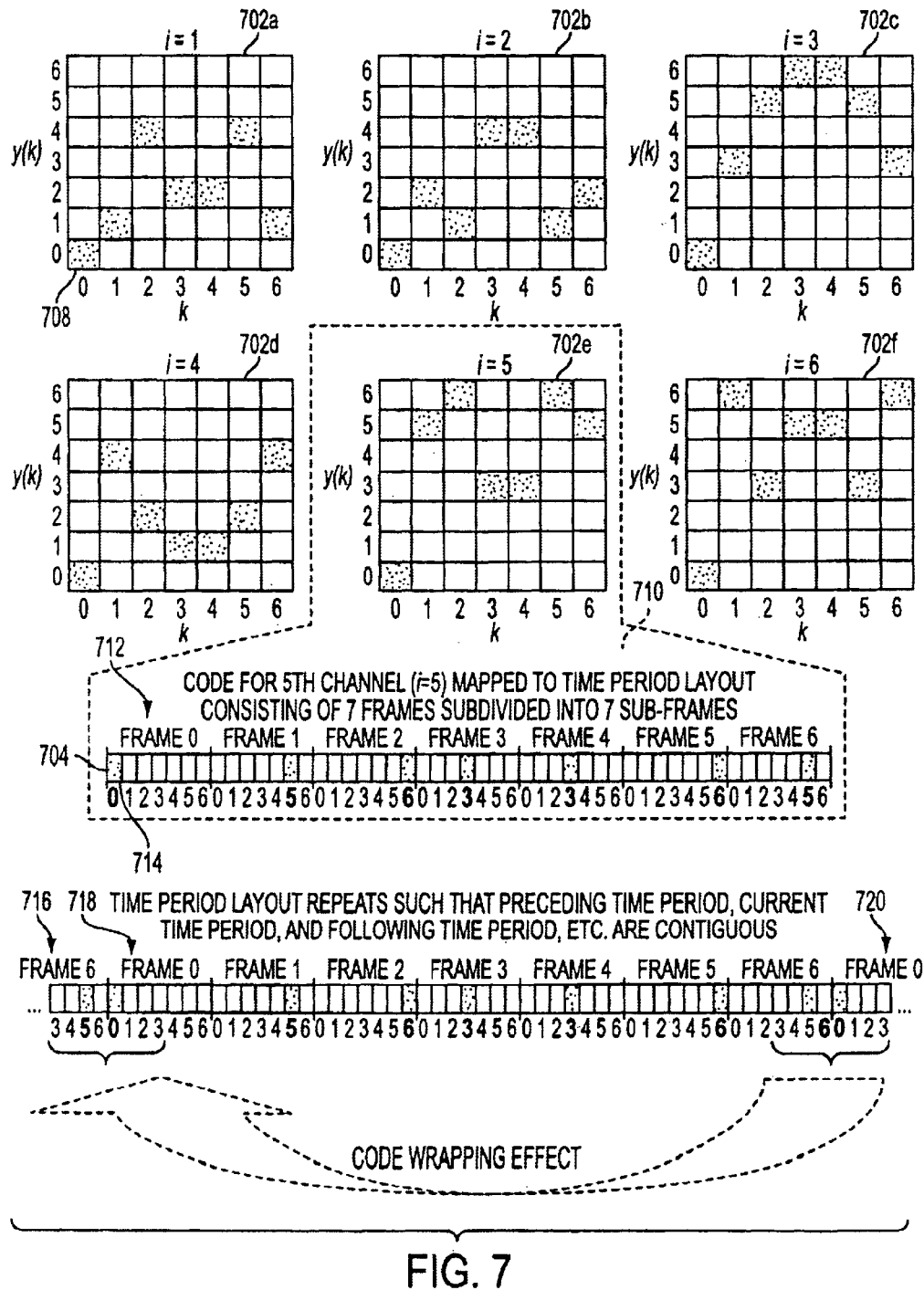
FIG. 7 depicts generation of family of quadratic congruential codes comprising 6 channels, mapping of the 5$^{th}$ channel code to a time period layout, and the code wrapping effect that occurs due to the code repeating over time.

FIG. 7 depicts the generation of quadratic congruential codes 702a–702f and the mapping of the $5^{th}$ code 702e to a time period layout 704 where the assumptions of the numerical code generation technique are valid. The code generation equation 706, $y(k) = i\,k^2 \mod 7$, is consistent with the general form discussed earlier where a and , have both been assigned a value of 0, and p has been assigned a value of 7. Six codes 702a–702f representing six channels are produced and displayed in matrix form where the darkened squares 708 represent code element values. Thus for channels i=1 to 6, the six codes 702a–702f presented are {0,1,4,2,2,4,1}, {0,2, 1,4,4,1,2}, {0,3,5,6,6,5,3}, {0,4,2,1,1,2,4}, {0,5,6,3,3,6,5}, and {0,6,3,5,5,3,6}. The outlined region about the $5^{th}$ code 702e (i=5) illustrates how the code 702e maps to a time period layout 704 consisting of seven frames 712 where each frame 712 is subdivided into seven sub-frames 714. Each column k maps to a frame 712 and the row y(k) highlighted for each column k represents the sub-frame 714 y(k) in which to place a pulse. The bottom of the figure illustrates how the time period layout 704 repeats. As shown, the last frame of a preceding time period 716 is contiguous with the first frame of a current time period 718 and the last frame of the current time period 718 is contiguous with the first frame of a following time period 720. Thus, whenever the start of a time period is shifted in time by some offset, a code wrapping effect occurs.

Exemplary Transceiver Implementation Transmitter

Figure 8:
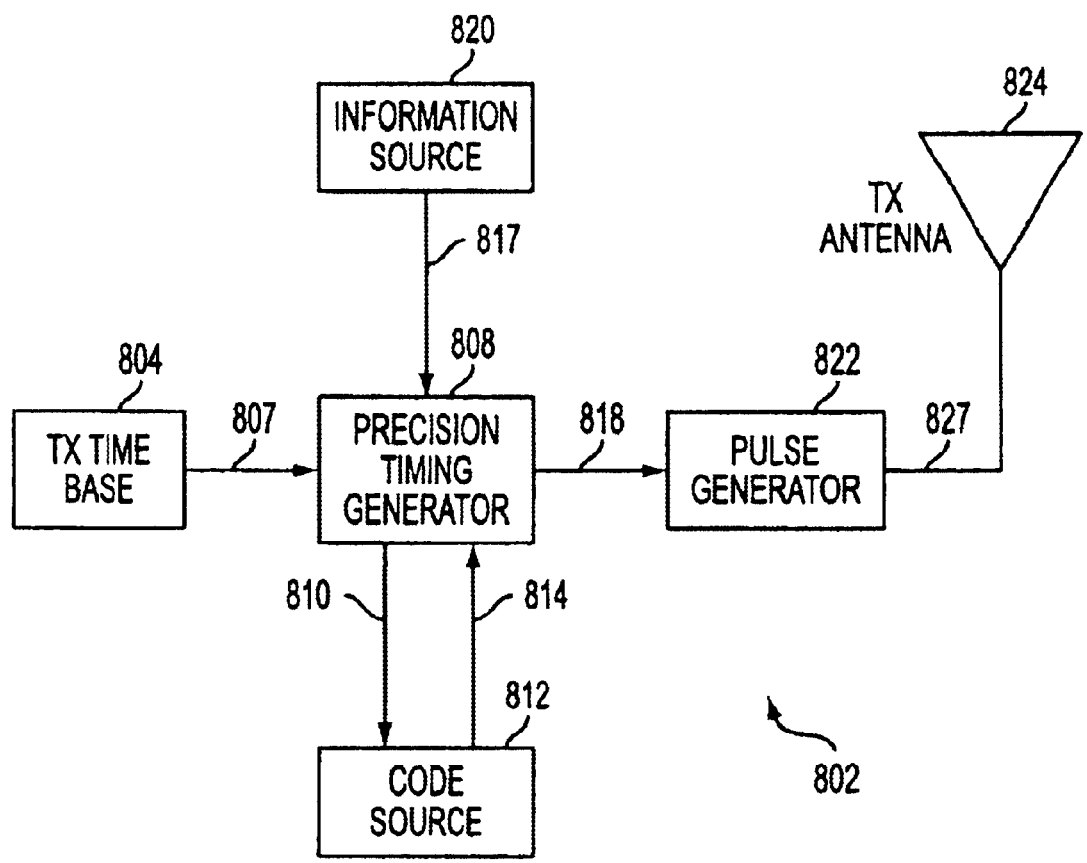
FIG. 8 is a block diagram of an impulse transmitter that advantageously uses the present invention.

An exemplary embodiment of an impulse radio transmitter 802 of an impulse radio communication system having one subcarrier channel will now be described with reference to FIG. 8.

The transmitter 802 comprises a time base 804 that generates a periodic timing signal 807. The time base 804 typically comprises a voltage controlled oscillator (VCO), or the like, having a high timing accuracy and low jitter, on the order of picoseconds (ps). The voltage control to adjust the VCO center frequency is set at calibration to the desired center frequency used to define the transmitters nominal pulse repetition rate. The periodic timing signal 807 is supplied to a precision timing generator 808.

The precision timing generator 808 supplies synchronizing signals 810 to the code source 812 and utilizes the code source output 814 together with an internally generated subcarrier signal (which is optional) and an information signal 817 to generate a modulated, coded timing signal 818.

The code source 812 comprises a storage device such as a random access memory (RAM), read only memory (ROM), or the like, for storing suitable time-hopping codes and for outputting the time-hopping codes as a code signal 814. Alternatively, maximum length shift registers or other computational means can be used to generate the time-hopping codes.

An information source 820 supplies the information signal 817 to the precision timing generator 808. The information signal 817 can be any type of intelligence, including digital bits representing voice, data, imagery, or the like, analog signals, or complex signals.

Figure 9:
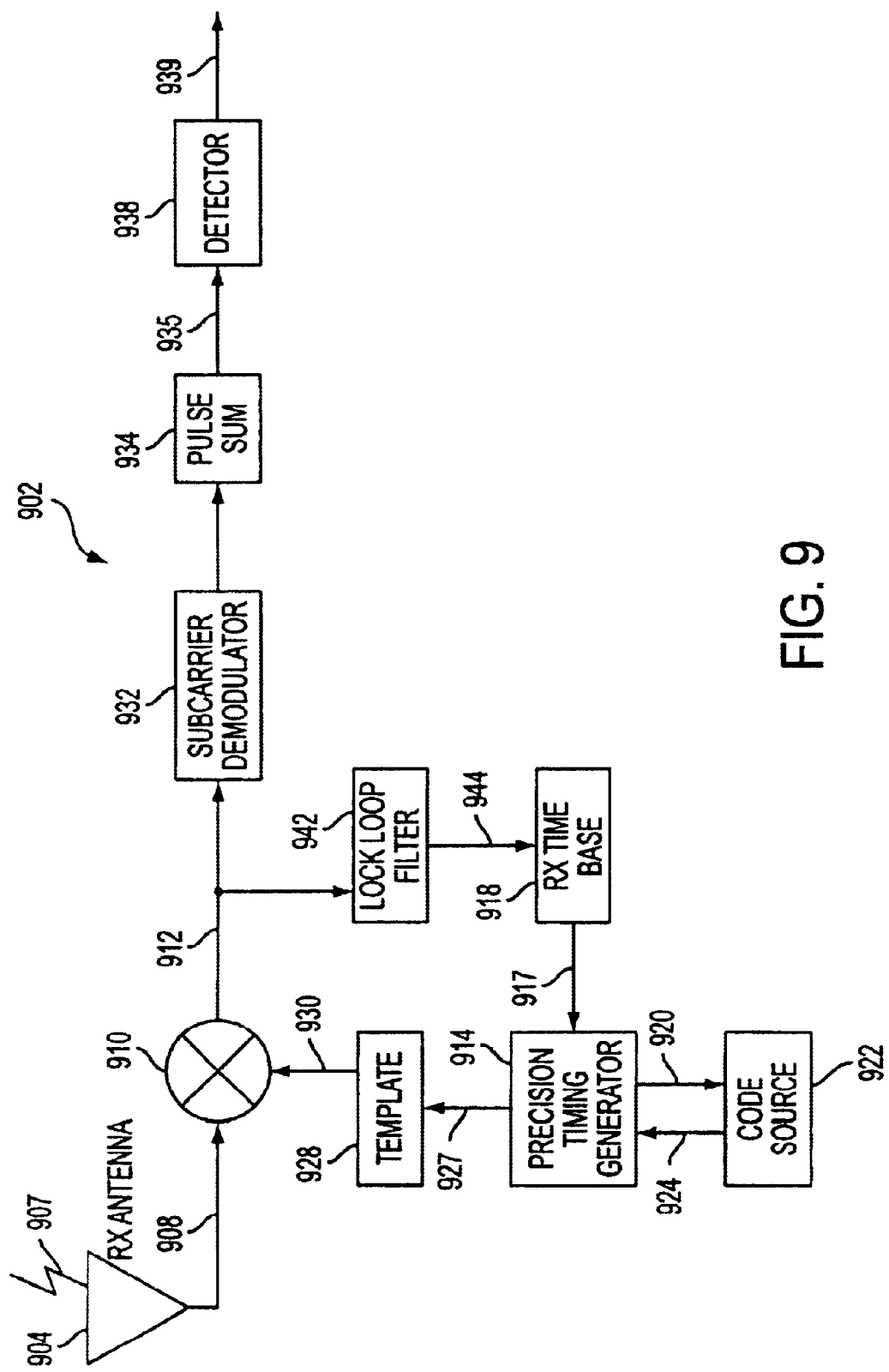
FIG. 9 is a block diagram of an impulse transmitter that advantageously uses the present invention.

A pulse generator 822 uses the modulated, coded timing signal 818 as a trigger to generate output pulses. The output pulses are sent to a transmit antenna 824 via a transmission line 827 coupled thereto. The output pulses are converted into propagating electromagnetic pulses by the transmit antenna 824. In the present embodiment, the electromagnetic pulses are called the emitted signal, and propagate to an impulse radio receiver 902, such as shown in FIG. 9, through a propagation medium, such as air, in a radio frequency embodiment. In a preferred embodiment, the emitted signal is wide-band or ultrawide-band, approaching a monocycle pulse as in FIG. 3a. However, the emitted signal can be spectrally modified by filtering of the pulses. This filtering will usually cause each monocycle pulse to have more zero crossings (more cycles) in the time domain. In this case, the impulse radio receiver can use a similar waveform as the template signal in the cross correlator for efficient conversion.

Receiver

An exemplary embodiment of an impulse radio receiver 902 (hereinafter called the receiver) for the impulse radio communication system is now described with reference to FIG. 9. More specifically, the system illustrated in FIG. 9 is for reception of digital data wherein one or more pulses are transmitted for each data bit.

The receiver 902 comprises a receive antenna 904 for receiving a propagated impulse radio signal 907. A received signal 908 from the receive antenna 904 is coupled to a cross correlator or sampler 910 to produce a baseband output 912. The cross correlator or sampler 910 includes multiply and integrate functions together with any necessary filters to optimize signal to noise ratio.

The receiver 902 also includes a precision timing generator 914, which receives a periodic timing signal 917 from a receiver time base 918. This time base 918 is adjustable and controllable in time, frequency, or phase, as required by the lock loop in order to lock on the received signal 908. The precision timing generator 914 provides synchronizing signals 920 to the code source 922 and receives a code control signal 924 from the code source 922. The precision timing generator 914 utilizes the periodic timing signal 917 and code control signal 924 to produce a coded timing signal 927. The template generator 928 is triggered by this coded timing signal 927 and produces a train of template signal pulses 930 ideally having waveforms substantially equivalent to each pulse of the received signal 908. The code for receiving a given signal is the same code utilized by the originating transmitter 802 to generate the propagated signal 907. Thus, the timing of the template pulse train 930 matches the timing of the received signal pulse train 908, allowing the received signal 908 to be synchronously sampled in the correlator 910. The correlator 910 ideally comprises a multiplier followed by a short-term integrator to sum the multiplier product over the pulse interval.

Further examples and details of correlation and sampling processes can be found in commonly owned U.S. Pat. Nos. 4,641,317, 4,743,906, 4,813,057, and 4,979,186, which are incorporation herein by reference, and commonly owned and application Ser. No. 09/356,384, filed Jul. 16, 1999, titled: "Baseband Signal Converter Device for a Wideband Impulse Radio Receiver," now U.S. Pat. No. 6,421,389, which is incorporated herein by reference.

The output of the correlator 910, also called a baseband signal 912, is coupled to a subcarrier demodulator 932, which demodulates the subcarrier information signal from the subcarrier. The purpose of the optional subcarrier process, when used, is to move the information signal away from DC (zero frequency) to improve immunity to low frequency noise and offsets. The output of the subcarrier demodulator 932 is then filtered or integrated in a pulse summation stage 934. The pulse summation stage produces an output representative of the sum of a number of pulse signals comprising a single data bit. The output of the pulse summation stage 934 is then compared with a nominal zero (or reference) signal output in a detector stage 938 to determine an output signal 939 representing an estimate of the original information signal 817.

The baseband signal 912 is also input to a lowpass filter 942 (also referred to as lock loop filter 942). A control loop comprising the lowpass filter 942, time base 918, precision timing generator 914, template generator 928, and correlator 910 is used to generate a filtered error signal 944. The filtered error signal 844 provides adjustments to the adjustable time base 918 to time position the periodic timing signal 927 in relation to the position of the received signal 908.

In a transceiver embodiment, substantial economy can be achieved by sharing part or all of several of the functions of the transmitter 802 and receiver 902. Some of these include the time base 918, precision timing generator 914, code source 922, antenna 904, and the like.

Figure 10:
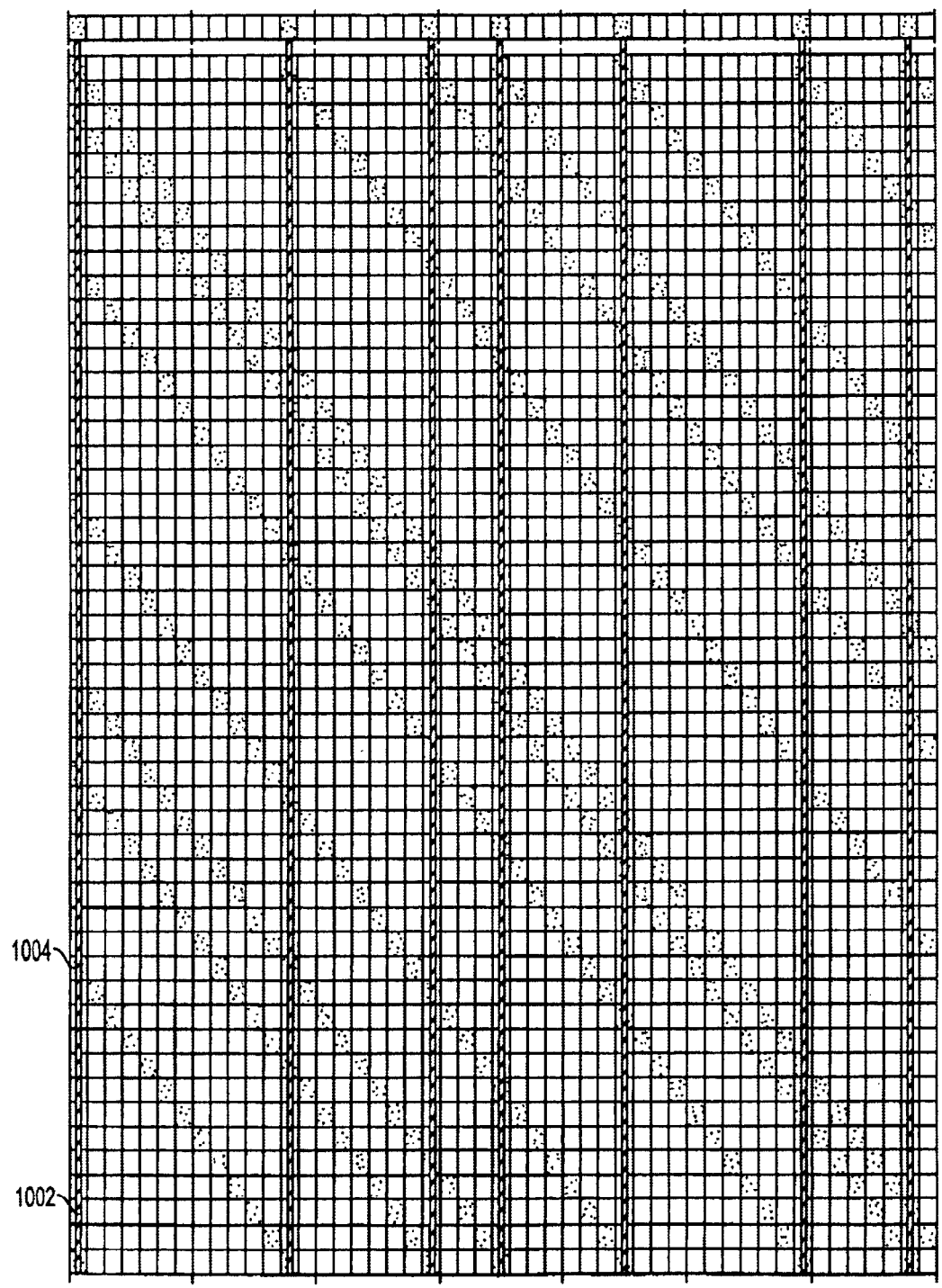
FIG. 10 illustrates autocorrelation properties of the 5$^{th}$ channel code of FIG. 7.
Figure 11:
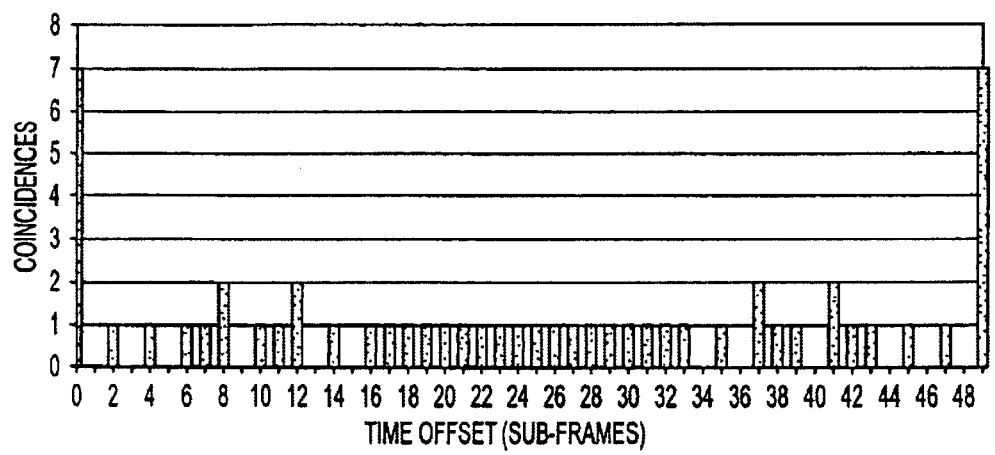
FIG. 11 is a plot diagram for illustrating the number of coincidences against a time offset in the example of FIG. 7.
Figure 12:
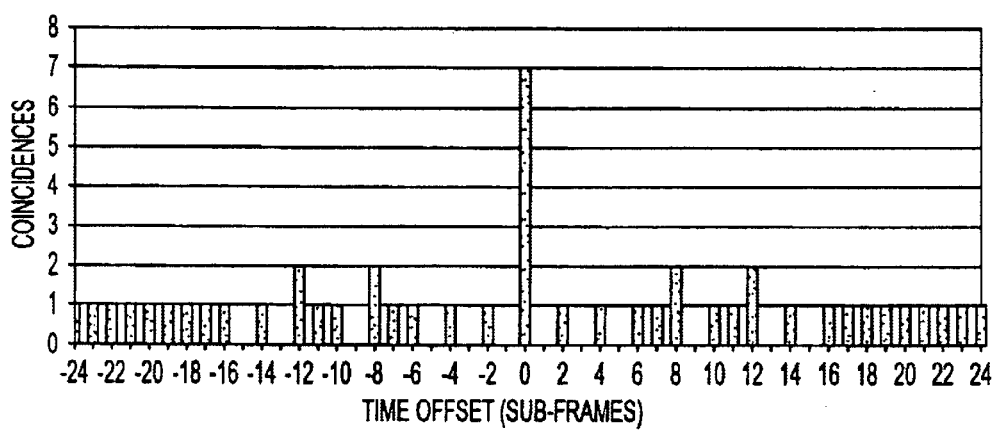
FIG. 12 is an example embodiment of a plot illustrating moving and re-plotting the data of FIG. 1 producing an exemplary 'thumbtack' plot.

FIG. 10 presents the autocorrelation properties of the $5^{th}$ code 702e where the time period layout 704 shown in FIG. 7 is correlated against other instances of the time period that are incrementally shifting in time by offsets equal to multiples of the width of a sub-frame. For an impulse radio system, the incremental time shifting may correspond to a synchronization process between an impulse receiver and a transmitter, for example, the receiver 802 and the transmitter 902. For example, an initial synchronization process between the impulse radio receiver and transmitter 802 and 902 may involve performing an incremental time shifting or time wrapping of a transmitted code against the same code, which is known at the receiver a priori. FIG. 10 illustrates how the wrapping effect takes place, where with each shift of the correlated time period, the last sub-frame is moved or wraps to the front of the time period. The striped bars 1002 are used to identify the coincidences that occur when the time period is correlated against the shifted instances of itself, i.e., autocorrelated. Whenever a darkened sub-frame 1004 appears behind a striped bar 1002, a coincidence occurs. Thus it can be seen that when correlated against itself with no time offset, a total of seven coincidences occur, while for other offsets the number of coincidences varies from zero to two. FIG. 11 plots the number of coincidences versus the time offset (i.e., number of sub-frames shifted). FIG. 12 plots the same data where the last half of the plot is moved to the front of the plots which is allowable due to the wrapping effect described previously. This moving and re-plotting of the data produces what is commonly referred to as a 'thumbtack' plot.

Figure 13:
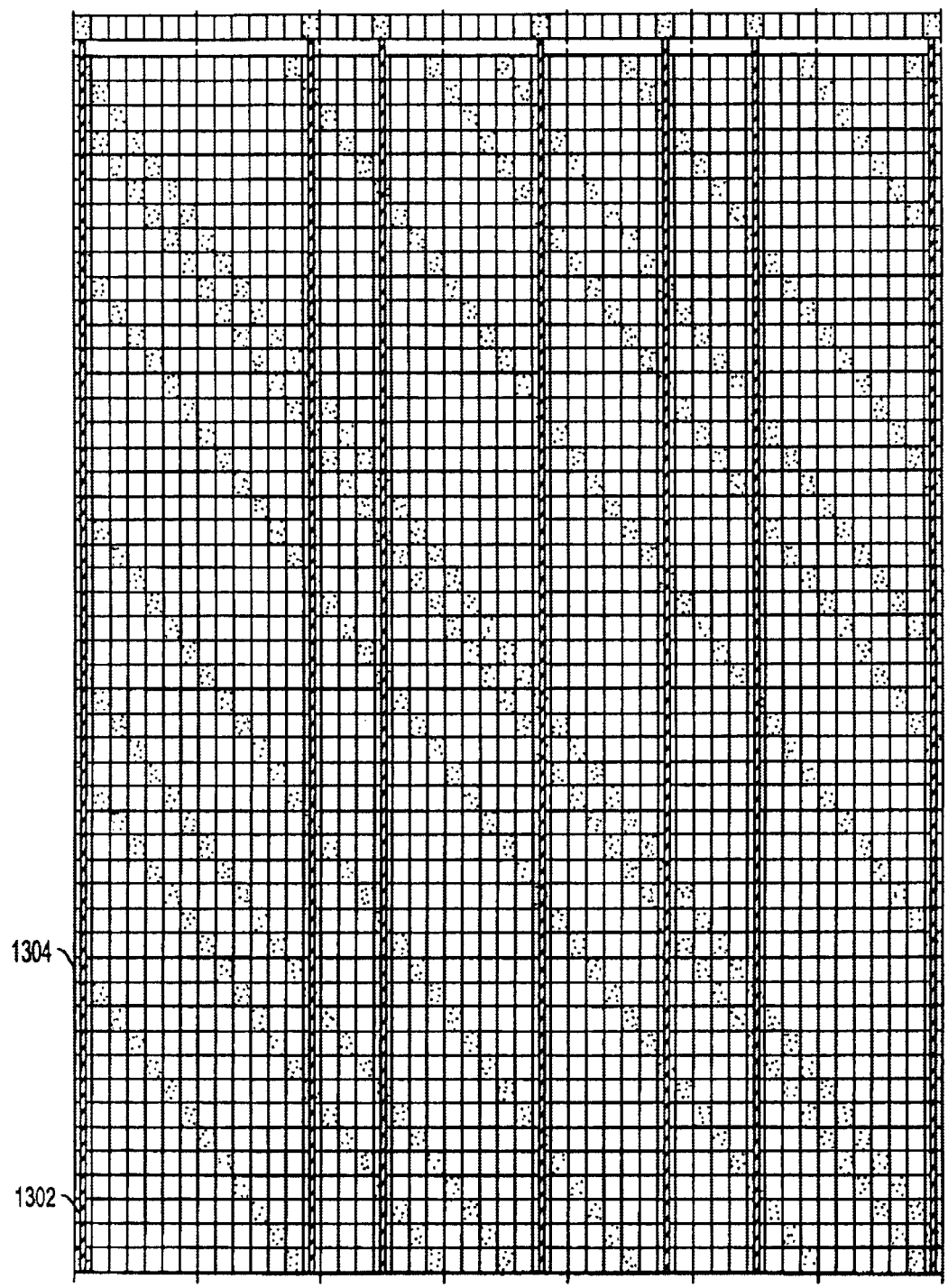
FIG. 13 illustrates cross-correlation properties of the 6$^{th}$ channel code relative to the 5$^{th}$ channel code of FIG. 7.
Figure 14:
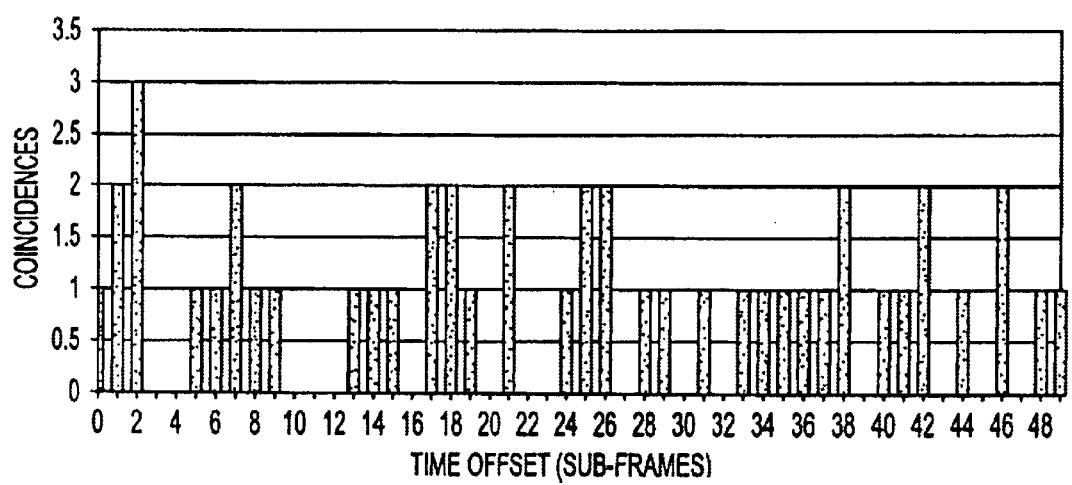
FIG. 14 is an example embodiment of a plot illustratively plotting coincidences of the cross-correlation of the 6$^{th}$ and 5$^{th}$ codes of FIG. 7 by time offset.

FIG. 13 presents the cross-correlation of the $5^{th}$ and $6^{th}$ codes, 702e and 702f. In this figure a time period produced by mapped the $6^{th}$ code 702f is shown correlated against instances of the $5^{th}$ code 702e that are incrementally shifted in time by offsets equal to multiples of the width of a sub-frame. The cross-correlation properties may be important in reducing interference in a multiple access impulse radio system between the receivers and transmitters 802 and 902. The striped bars 1302 are used to identify coincidences that occur when the time period produced with the $6^{th}$ code 702f is correlated against the shifted instances of a time period produced with the $5^{th}$ code 702e. The coincidences can be seen whenever a darkened sub-frame 1304 appears behind a striped bar 1302. It should be noted that the-instances of the $5^{th}$ code 702e shown in FIG. 13 are the same as those shown in FIG. 10. The cross-correlation of these two codes is depicted in FIG. 14, which shows the maximum number of coincidences that occurs is three.

As described above, a coding method for a pulse position modulation communication system specifies pulse positioning over time in accordance with a time layout about a time reference. After generating a time-hopping code, the method of the invention maps pulses over the time layout based-on the time hopping code at any location within the time layout.

The pulse positioning may be relative to a time reference, for example, a time position of a pulse that may be a preceding pulse or a succeeding pulse. As stated above the time-hopping code may have predefined properties, such as autocorrelation properties, cross-correlation properties, or spectral properties. By mapping codes to contiguous same-sized time period components and positioning pulses such that they are contained entirely within the time period components, the present invention produces a pulse train that inherits the correlation properties inherent to the code generation technique used to generate the code.

What is claimed is:

1. A method for positioning pulses, comprising the steps of:

specifying pulse positioning over time in accordance with contiguous repeating time layouts about a time reference, generating a time-hopping code; and mapping pulses to the contiguous repeating time layouts based on the time hopping code, wherein said pulses can be placed at any location within said contiguous repeating time layouts.

2. The method of claim 1, wherein said time reference is a time position of a selected pulse of said pulses.

3. The method of claim 2, wherein said selected pulse is a preceding pulse.

4. The method of claim 2, wherein said selected pulse is a succeeding pulse.

5. The method of claim 1, wherein said time reference is at least one of a fixed and a non-fixed time reference.

6. The method of claim 1, wherein said time hopping code has a predefined property.

7. The method of claim 6, wherein the pre-defined property is at least one of spectral properties and correlation properties.

8. The method of claim 7, wherein the correlation property comprises at least one of autocorrelation properties and cross-correlation properties.

9. The method of claim 1, wherein said time-hopping code comprises at least one of a hyperbolic congruential code, quadratic congruential code, linear congruential code, Welch-Costas array code, Golomb-Costas array code, pseudorandom code, chaotic code, and Optimal Golomb Ruler code.

10. The-method of claim 1, wherein each of the contiguous repeating time layouts is comprised of a plurality of frames.

11. The method of claim 10, wherein said frame is comprised of a plurality of sub-frames.

12. The method of claim 11, wherein said sub-fame is comprised of a plurality of smaller components.

13. The method of claim 12, wherein said smaller components are further subdivided.

14. The method claim 1, wherein the time layout is a delta value layout.

15. An impulse transmission system comprising:

a Ultra Wideband Transmitter;

a Ultra Wideband Receiver; and said Ultra Wideband Transmitter and said Ultra Wideband Receiver employ a time-hopping code, wherein said code specifies positioning of pulses over time in accordance with contiguous repeating time layouts about a time reference, and said pulses can be placed at any location within said contiguous repeating time layouts.

16. The impulse transmission system of claim 15, wherein said time reference is a time position of a selected pulse of said pulses.

17. The impulse transmission system of claim 16, wherein said selected pulse is a preceding pulse.

18. The impulse transmission system of claim 16, wherein said selected pulse is a succeeding pulse.

19. The impulse transmission system of claim 15, wherein said time reference is at least one of a fixed and a non-fixed time reference.

20. The impulse transmission system of claim 15, wherein said time hopping code has a predefined property.

21. The impulse transmission system of claim 20, wherein the pre-defined property is at least one of spectral properties and correlation properties.

22. The impulse transmission system of claim 21, wherein the correlation property comprises at least one of autocorrelation properties and cross-correlation properties.

23. The impulse transmission system of claim 15, wherein said time-hopping code comprises at least one of a hyperbolic congruential code, quadratic congruential code, linear congruential code, Welch-Costas array code, Golomb-Costas array code, pseudorandom code, chaotic code, and Optimal Golomb Ruler code.

24. The impulse transmission system of claim 15, wherein each of the continuous repeating time layouts is comprised of a plurality of frames.

25. The impulse transmission system of claim 24, wherein said frame is comprised of a plurality of sub-frames.

26. The impulse transmission system of claim 25, wherein said sub-frame is comprised of a plurality of smaller components.

27. The impulse transmission system of claim 26, wherein said smaller components are further subdivided.

28. The impulse transmission system claim 15, wherein the time layout is a delta value layout.

* * * * *